(12) United States Patent
Umino et al.

(10) Patent No.: US 11,024,572 B2
(45) Date of Patent: Jun. 1, 2021

(54) WIRING BOARD, ELECTRONIC DEVICE, AND ELECTRONIC MODULE

(71) Applicant: KYOCERA Corporation, Kyoto (JP)

(72) Inventors: Hidehisa Umino, Kyoto (JP); Yousuke Moriyama, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/463,915

(22) PCT Filed: Nov. 28, 2017

(86) PCT No.: PCT/JP2017/042618
§ 371 (c)(1),
(2) Date: May 24, 2019

(87) PCT Pub. No.: WO2018/097313
PCT Pub. Date: May 31, 2018

(65) Prior Publication Data
US 2020/0075472 A1    Mar. 5, 2020

(30) Foreign Application Priority Data
Nov. 28, 2015 (JP) .............................. JP2016-230215

(51) Int. Cl.
  *H01L 23/498* (2006.01)
  *H01L 33/62* (2010.01)
  *H01L 41/047* (2006.01)

(52) U.S. Cl.
  CPC ........ *H01L 23/49838* (2013.01); *H01L 33/62* (2013.01); *H01L 41/0475* (2013.01)

(58) Field of Classification Search
  CPC .............. H01L 23/49838; H01L 33/62; H01L 41/0475; H01L 2924/15174; H01L 2224/16225; H01L 2224/48091; H01L 2224/48227; H01L 23/12; H01L 23/13; H01L 23/36; H01L 2924/181; H05K 3/3442; H05K 3/3436; H05K 2201/2072; H05K 2201/09736; H05K 2201/098; H05K 2201/09272; H05K 2201/0919;
  (Continued)

(56) References Cited

U.S. PATENT DOCUMENTS 9,848,491 B2 * 12/2017 Ueki ....................... H01L 23/12
2005/0055814 A1 * 3/2005 Hatanaka ............. H03H 9/0552
29/25.35
(Continued)

FOREIGN PATENT DOCUMENTS

JP    2002-158509 A    5/2002
JP    2005-159083 A    6/2005
(Continued)

*Primary Examiner* — Bitew A Dinke
(74) *Attorney, Agent, or Firm* — Volpe Koenig

(57) ABSTRACT

A wiring board includes an insulating substrate including a cutout portion that opens in a main surface of the insulating substrate and a side surface of the insulating substrate, an inner surface electrode on an inner surface of the cutout portion, an external electrode on the main surface of the insulating substrate, and a connecting section where the inner surface electrode and the external electrode are connected to each other. The connecting section is thicker than the inner surface electrode and the external electrode.

18 Claims, 20 Drawing Sheets

(58) Field of Classification Search
CPC .......... H05K 2201/09181; H05K 2201/09163; H05K 2201/09381; H05K 1/117; H05K 1/119; H05K 3/403

See application file for complete search history.

(56) References Cited

U.S. PATENT DOCUMENTS

| | | | |
|---|---|---|---|
| 2007/0200221 A1 | 8/2007 | Suesada et al. | |
| 2012/0012356 A1* | 1/2012 | Satoh | H03H 9/1035 174/50.52 |
| 2012/0098137 A1* | 4/2012 | Usui | H05K 3/445 257/771 |
| 2012/0104524 A1* | 5/2012 | Takeshita | H01L 27/14618 257/432 |
| 2014/0021627 A1* | 1/2014 | Kimura | H01L 24/16 257/773 |
| 2015/0146397 A1* | 5/2015 | Fujihara | H01L 33/62 361/767 |
| 2015/0305160 A1* | 10/2015 | Funahashi | H04N 5/2253 348/374 |
| 2016/0007447 A1* | 1/2016 | Funahashi | H01L 27/14618 348/375 |
| 2016/0372407 A1* | 12/2016 | Murakami | H01L 24/05 |
| 2017/0071058 A1* | 3/2017 | Ueki | H05K 5/0026 |
| 2018/0040773 A1 | 2/2018 | Fukuda et al. | |
| 2020/0105658 A1* | 4/2020 | Baba | H01L 33/647 |

FOREIGN PATENT DOCUMENTS

| | | | | |
|---|---|---|---|---|
| JP | 2015-146383 A | 8/2015 | | |
| JP | 2015-159139 A | 9/2015 | | |
| JP | 2015-225963 A | 12/2015 | | |
| JP | 2016-207886 A | 12/2016 | | |
| JP | 6166194 B2 * | 7/2017 | | |
| WO | 2006/114971 A2 | 11/2006 | | |
| WO | 2009/044737 A1 | 4/2009 | | |
| WO | 2014/115766 A1 | 7/2014 | | |
| WO | WO-2014119729 A1 * | 8/2014 | ........... | H05K 1/0306 |
| WO | WO-2015060387 A1 * | 4/2015 | ............ | H05K 3/403 |
| WO | WO-2015163354 A1 * | 10/2015 | ............ | H05K 1/181 |
| WO | 2016/136733 A1 | 9/2016 | | |

* cited by examiner

← DIRECTION A

←DIRECTION A

PORTION A

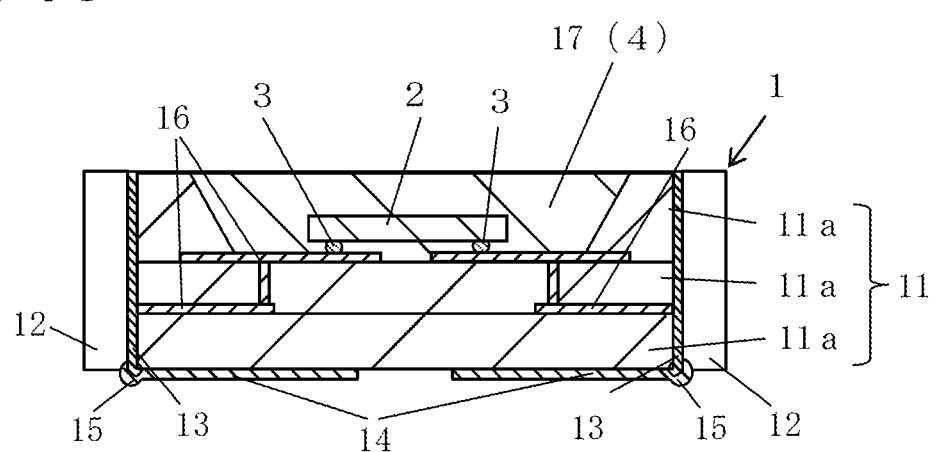
FIG. 18
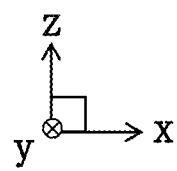

WIRING BOARD, ELECTRONIC DEVICE, AND ELECTRONIC MODULE

TECHNICAL FIELD

The present invention relates to a wiring board, an electronic device, and an electronic module.

BACKGROUND ART

Hitherto, a known wiring board has included an insulating substrate having cutout portions that open in a main surface of the insulating substrate and side surfaces of the insulating substrate, inner surface electrodes on inner surfaces of the corresponding cutout portions, and external electrodes on the main surface of the insulating substrate. When an electronic device including the wiring board is to be joined to, for example, a module substrate by a joining material, such as a solder, the inner surface electrodes and the external electrodes are joined to an external circuit board by a joining material, such as a solder (refer to Japanese Unexamined Patent Application Publication No. 2002-158509).

SUMMARY OF INVENTION

A wiring board of the present disclosure includes an insulating substrate comprising a cutout portion that opens in a main surface of the insulating substrate and a side surface of the insulating substrate, an inner surface electrode on an inner surface of the cutout portion, an external electrode on the main surface of the insulating substrate, and a connecting section where the inner surface electrode and the external electrode are connected to each other. The connecting section is thicker than the inner surface electrode and the external electrode.

An electronic device of the present disclosure includes the wiring board having the above-described structure, and an electronic component on the wiring board.

An electronic module of the present disclosure includes a module substrate including a connection pad, and the electronic device having the above-described structure connected to the connection pad by a solder.

BRIEF DESCRIPTION OF DRAWINGS

FIG. 18 is a vertical sectional view along line A-A of the electronic device shown in FIG. 17A.

DESCRIPTION OF EMBODIMENTS

Figure 1A:
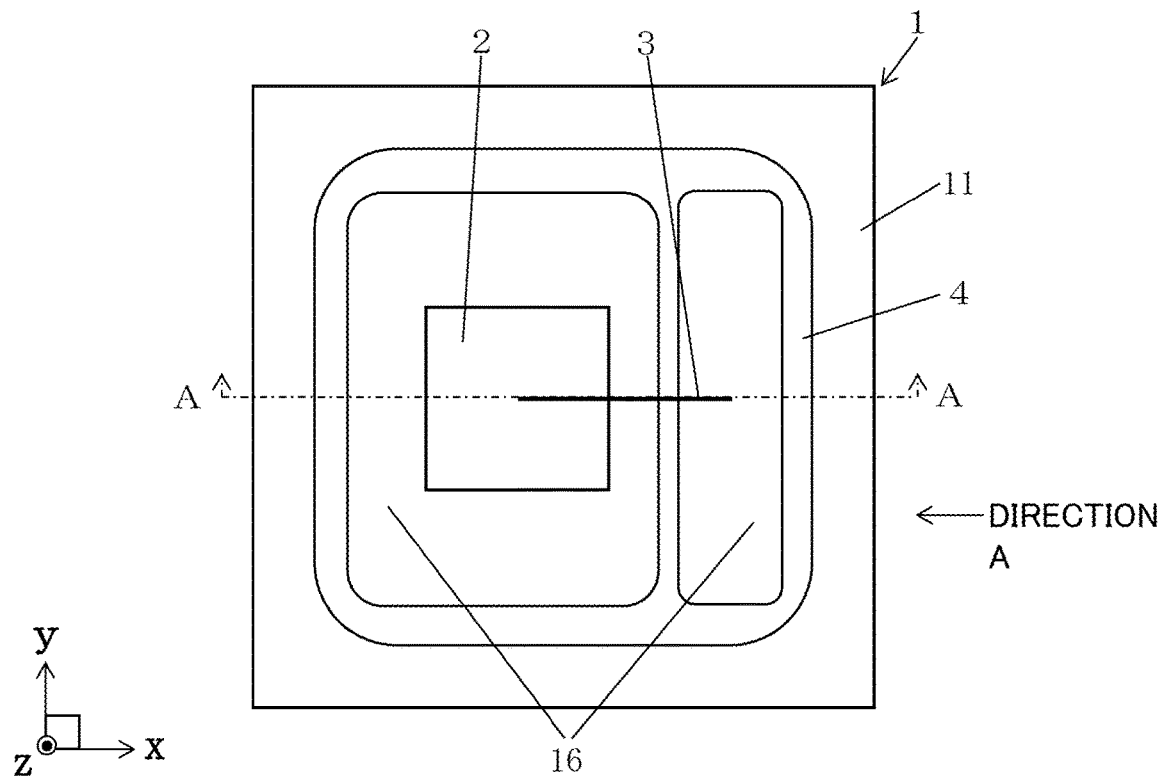
FIG. 1A is a top view of an electronic device of a first embodiment.

Several exemplary embodiments of the present disclosure are described with reference to the attached drawings.

First Embodiment

As in an embodiment shown in FIGS. 1A to 6, an electronic device of a first embodiment includes a wiring board 1 and an electronic component 2 on an upper surface of the wiring board 1. As in the embodiment shown in FIG. 6, the electronic device is connected to, for example, connection pads 51 on a module substrate 5 by using a solder 6, the module substrate 5 constituting an electronic module.

The wiring board 1 of the present embodiment includes an insulating substrate 11 having cutout portions 12 that opens in a main surface of the insulating substrate 11 and side surface of the insulating substrate 11, inner surface electrodes 13 on inner surfaces of the corresponding cutout portions 12, and external electrodes 14 on the main surface of the insulating substrate 11. Wiring conductors 16 are positioned on a surface and in the inside of the insulating substrate 11. The wiring board 1 includes connecting sections 15 where the inner surface electrodes 13 and the corresponding external electrodes 14 are connected to each other. Each connecting section 15 is thicker than each inner surface electrode 13 and each external electrode 14. In FIGS. 1A to 6, the electronic device is mounted in an x-y plane in an imaginary x-y-z space. In FIGS. 1A to 6, an upper direction refers to a positive direction along an imaginary z axis. The distinction between the upper direction and lower direction in the description below is for convenience sake, and does not limit the upper direction and lower direction when, for example, the wiring board 1 is actually being used.

Figure 1B:
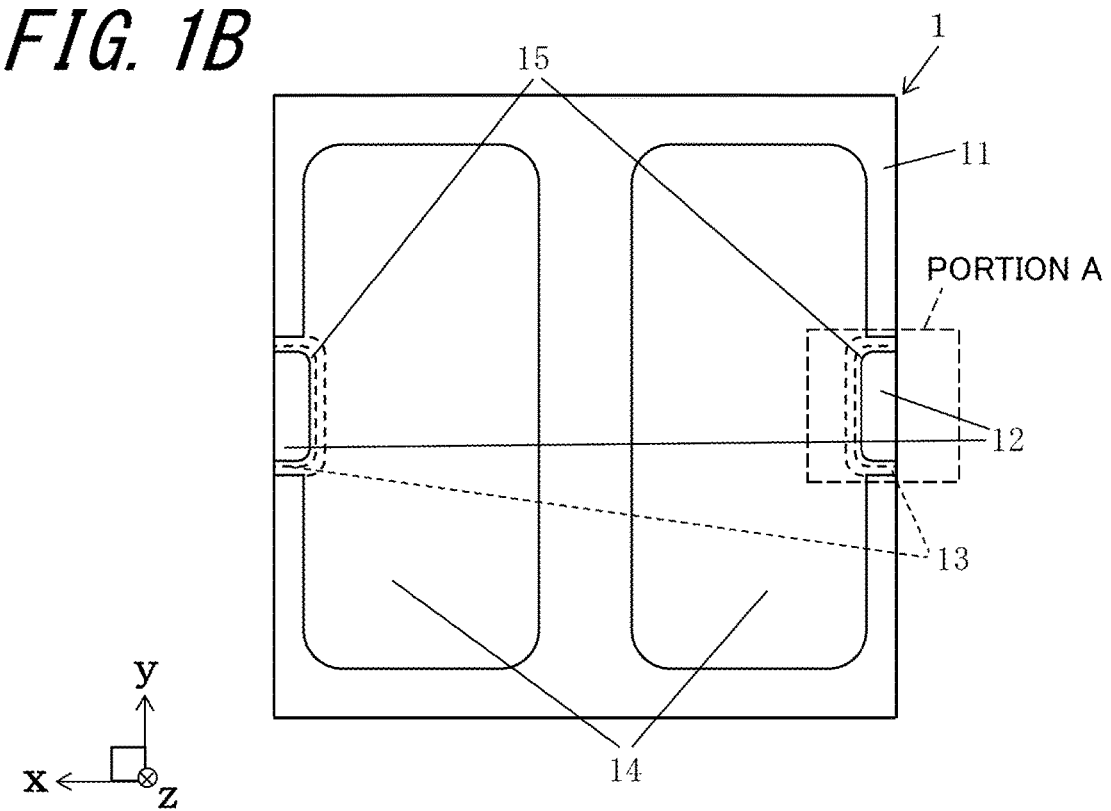
FIG. 1B is a bottom view of FIG. 1A.
Figure 3A:
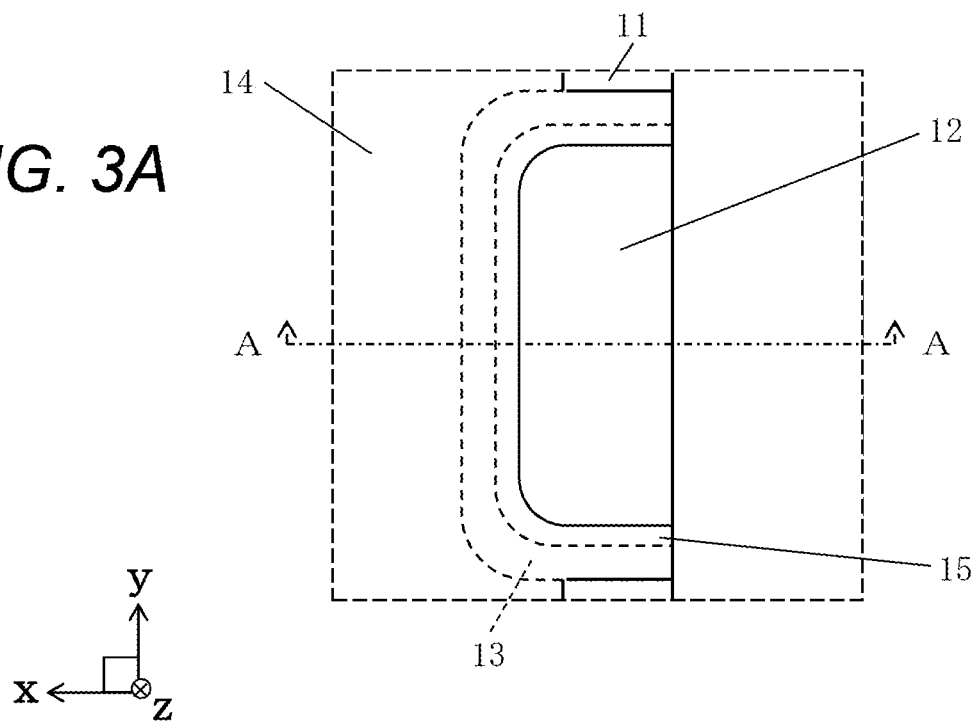
FIG. 3A is an enlarged bottom view of a main portion of a portion A of FIG. 1B.

In the embodiment shown in FIG. 1B and FIG. 3A, in plan perspective, a region of a side surface of each inner surface electrode 13 that overlaps its corresponding connecting section 15 is shown by broken lines.

The insulating substrate 11 includes a first main surface (a lower surface in FIGS. 1A to 6) and a second main surface (an upper surface in FIGS. 1A to 6), and side surfaces. The insulating substrate 11 includes a plurality of insulating layers 11a, and includes the cutout portions 12 that open in the corresponding main surface and in the side surfaces. The insulating substrate 11 functions as a supporting body for supporting the electronic component 2. The electronic component 2 is bonded and fixed to the corresponding main surface of the insulating substrate 11 by a connecting member, such as a solder bump, a gold bump, a conductive resin (for example, an anisotropic conductive resin), or a resin.

The insulating substrate 11 can be made of, for example, ceramics, such as an aluminum oxide sintered body (aluminum ceramics), an aluminum nitride sintered body, a mullite sintered body, or a glass ceramics sintered body. If the insulating substrate 111 is, for example, an aluminum oxide sintered body, for example, a suitable organic binder and solvent are added to and mixed with powdered material, such as aluminum oxide ($Al_2O_3$), silicon oxide ($SiO_2$), magnesium oxide (MgO), or calcium oxide (CaO), to form a slurry. By using, for example, an existing and known doctor blade method or calendar roller method, the slurry is formed into a sheet to form a ceramic green sheet. Next, the ceramic green sheet is appropriately punched, and, if necessary, a plurality of ceramic green sheets is laminated to form a green body. Then, the green body is fired at a high temperature (approximately 1600° C.) to manufacture the insulating substrate 11 including the plurality of insulating layers 11a.

In the embodiment shown in FIGS. 1A to 6, the insulating substrate 11 includes two insulating layers 11a. Each cutout portion 12 is disposed at the insulating layer 11a on a side of the first main surface of the two insulating layers 11a of the insulating substrate 11. The cutout portions 12 open in the corresponding main surface and the side surfaces of the insulating substrate 11. In the embodiment shown in FIGS. 1A to 4, the cutout portions 12 open in the first main surface and the side surfaces of the insulating substrate 11, and, in plan view, have a shape formed by dividing a rectangular columnar shape so as to have arc-shaped corner portions. The inner surface electrodes 13 are disposed on the inner surfaces of the corresponding cutout portions 12. In the plan view, the cutout portions 12 may have a semicircular shape, a semielliptical shape, a semi-oval shape, or a shape formed by dividing a columnar shape where cutout portions of a plurality of sizes overlap each other. In the embodiment shown in FIGS. 1A and 1B, the cutout portions 12 open in two facing side surfaces of the insulating substrate 11, and face each other.

The cutout portions 12 can be formed, for example, by forming through holes, which become the cutout portions 12, in a corresponding one of several ceramic green sheets for the insulating substrate 11 by performing laser processing, punching using a die, or the like on the ceramic green sheets. As in the embodiment shown in FIGS. 1A to 4, the cutout portions 12 that opens in the first main surface of the insulating substrate 11 and the side surface of the insulating substrate 11 can be formed by laminating the aforementioned ceramic green sheets upon other ceramic green sheets that do not have through holes.

The inner surface electrodes 13, the external electrodes 14, the connecting sections 15, and the wiring conductors 16 are disposed at the surfaces and the inside of the insulating substrate 11. The inner surface electrodes 13 are positioned on the inner surfaces of the corresponding cutout portions 12. The external electrodes 14 are positioned on the first main surface of the insulating substrate 11. The inner surface electrodes 13 and the external electrodes 14 are connected to each other at the corresponding connecting sections 15 that are positioned at the openings of the cutout portions 12. The connecting sections 15 are positioned and cover lower surfaces of the inner surface electrodes 13 and side end surfaces of the inner surface electrodes 13. The wiring conductors 16 are disposed on a surface and the inside of the insulating substrate 11, and include wiring layers on this surface of the insulating layer 11a and through conductors in a thickness direction (z direction in FIGS. 1A to 6) of the insulating layer 11a. In the embodiment shown in FIGS. 1A, 1B and 2, one end portion of each wiring conductor 16 is led out to the second main surface of the insulating substrate 11, and the other end portion of each wiring conductor 16 is connected to its corresponding inner surface electrode 13 at a bottom portion of its corresponding cutout portion 12. The inner surface electrodes 13, the external electrodes 14, the connecting sections 15, and the wiring conductors 16 are disposed for electrically connecting the electronic component 2 and the module substrate 5 to each other.

A thickness T3 of each connecting section 15 is greater than a thickness T1 of each inner surface electrode 13 and a thickness T2 of each external electrode 14 (T3>T1, T3>T2). The thickness T1 of each inner surface electrode 13 is a thickness from the inner surface of its corresponding cutout portion 12 to a surface of its corresponding inner surface electrode 13. The thickness T2 of each external electrode 14 is a thickness from the corresponding main surface of the insulating substrate 11 to a surface of its corresponding external electrode 14. The thickness T3 of each connecting section 15 is a thickness from the inner surface of its corresponding cutout portion 12 or the corresponding main surface of the insulating substrate 11 to a surface of its corresponding connecting section 15. The thickness T3 of each connecting section 15 is set in a range of substantially $1.1T1 \leq T3 \leq 3T1$, and $1.1T2 \leq T3 \leq 3T2$.

The inner surface electrodes 13, the external electrodes 14, the connecting sections 15, and the wiring conductors 16 are formed from, for example, a metalizing metallic powder whose main component is, for example, tungsten (W), molybdenum (Mo), manganese (Mn), silver (Ag), or copper (Cu). For example, when the insulating substrate 11 is formed from an aluminum oxide sintered body, a metalizing paste, acquired by adding and mixing, for example, an appropriate organic binder and solvent to and with a high-melting-point metallic powder (such as W, Mo, or Mn powder), is previously printed onto and applied to ceramic green sheets for the insulating substrate 11 into a predetermined pattern by screen printing or the like, and is fired at the same time as the ceramic green sheets for the insulating substrate 11, in order to be deposited and formed on predetermined positions of the insulating substrate 11. The inner surface electrodes 13 and the connecting sections 15 are formed by printing and applying a metalizing paste for the inner surface electrodes 13 onto and to the inner surfaces of through holes for the cutout portions 12 in the ceramic green sheets for the insulating substrate 11 by printing means, such as screen printing, and firing the metalizing paste together with the ceramic green sheets for the insulating substrate 11. The external electrodes 14, the connecting sections 15, and the wiring layers of the wiring conductors 16 are formed by printing and applying a metalizing paste for the external electrodes 14, the connecting sections 15, and the wiring layers of the wiring conductors 16 onto and to corresponding surfaces of the ceramic green sheets for the insulating substrate 11 by printing means, such as screen printing, and firing the metalizing paste together with the ceramic green sheets for the insulating substrate 11. When the wiring conductors 16 are through conductors, the wiring conductors 16 are formed, for example, by forming through holes for the through conductors in the ceramic green sheets for the insulating substrate 11 by a processing method, such as laser processing or punching by using a die or a punch, filling the through holes with the metalizing paste for the through conductors, and firing the metalizing paste together with the ceramic green sheets for the insulating substrate 11. The metalizing paste is formed by adding a suitable solvent and binder to the above-described metallic powder and kneading the resulting mixture to have an appropriate viscosity. In order to increase the joining strength with the insulating substrate 11, the metalizing paste may contain glass powder or ceramic powder.

By electroplating or electroless plating, metallic plating layers are deposited onto surfaces of the inner surface electrodes 13, the external electrodes 14, the connecting sections 15, and the wiring conductors 16 that are exposed from the insulating substrate 11. The metallic plating layers are each made of a metal having good corrosion resistance and good connectability with a connecting member 3, such as nickel, copper, gold, or silver, and are formed, for example, by successively depositing a nickel plating layer having a thickness of approximately 0.5 µm to 5 µm and a gold plating layer having a thickness of approximately 0.1 µm to 3 µm. Therefore, it is possible to effectively suppress corrosion of the inner surface electrodes 13, the external electrodes 14, the connecting sections 15, and the wiring conductors 16; and to firmly join the wiring conductors 16 and the electronic component 2 to each other, the wiring conductors 16 and the connecting member 3, such as a bonding wire, to each other, and the inner surface electrodes 13, the external electrodes 14, and the connecting sections 15 to the connection pads 51 on the module substrate 5.

The metal plating layers are not limited to nickel/gold plating layers, and may be other types of metal plating layers such as nickel/palladium/gold plating layers.

The electronic device can be manufactured by mounting the electronic component 2 onto a mounting portion of the wiring board 1. Examples of the electronic component 2 that is mounted on the wiring board 1 include a semiconductor element, such as an IC chip or a LSI chip, a light emitting element, a piezoelectric element, such as a quartz oscillator or a piezoelectric oscillator, and various types of sensors. When the electronic component 2 is, for example, a wire-bonding semiconductor element, after fixing the semiconductor element to the mounting portion by a joining member, such as a low-melting-point brazing material or an electrically conductive resin, the semiconductor element is mounted onto the wiring board 1 by electrically connecting the electrodes of the semiconductor element and the wiring conductors 16 to each other by the connecting member 3, such as a bonding wire. This causes the electronic component 2 to be electrically connected to the wiring conductors 16. When the electronic component 2 is, for example, a flip-chip semiconductor element, the semiconductor element is mounted onto the wiring board 1 by electrically and mechanically connecting the electrodes of the semiconductor element and the wiring conductors 16 to each other by the connecting member 3, such as a solder bump, a gold bump, or an electrically conductive resin (such as an anisotropic conductive resin). The wiring board 1 may have a plurality of electronic components 2 mounted thereon or, as appropriate, may have a small electronic component, such as a resistive element or a capacitive element, mounted thereon. As appropriate, the electronic component 2 may be encapsulated with, for example, a lid, made of a resin, glass, a ceramic, a metal, or the like, by using an encapsulation member 4, made of a resin, glass, or the like.

Figure 6:
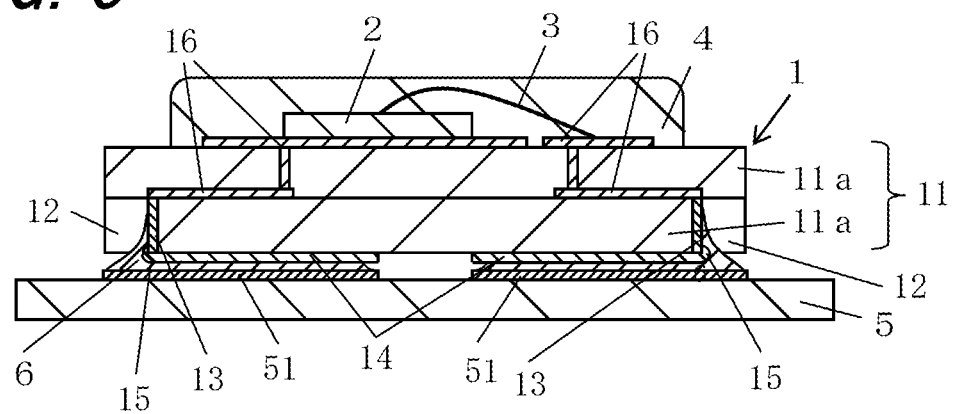
FIG. 6 is a vertical sectional view of an electronic module in which the electronic device in FIG. 1A is mounted on a module substrate.
Figure 7A:
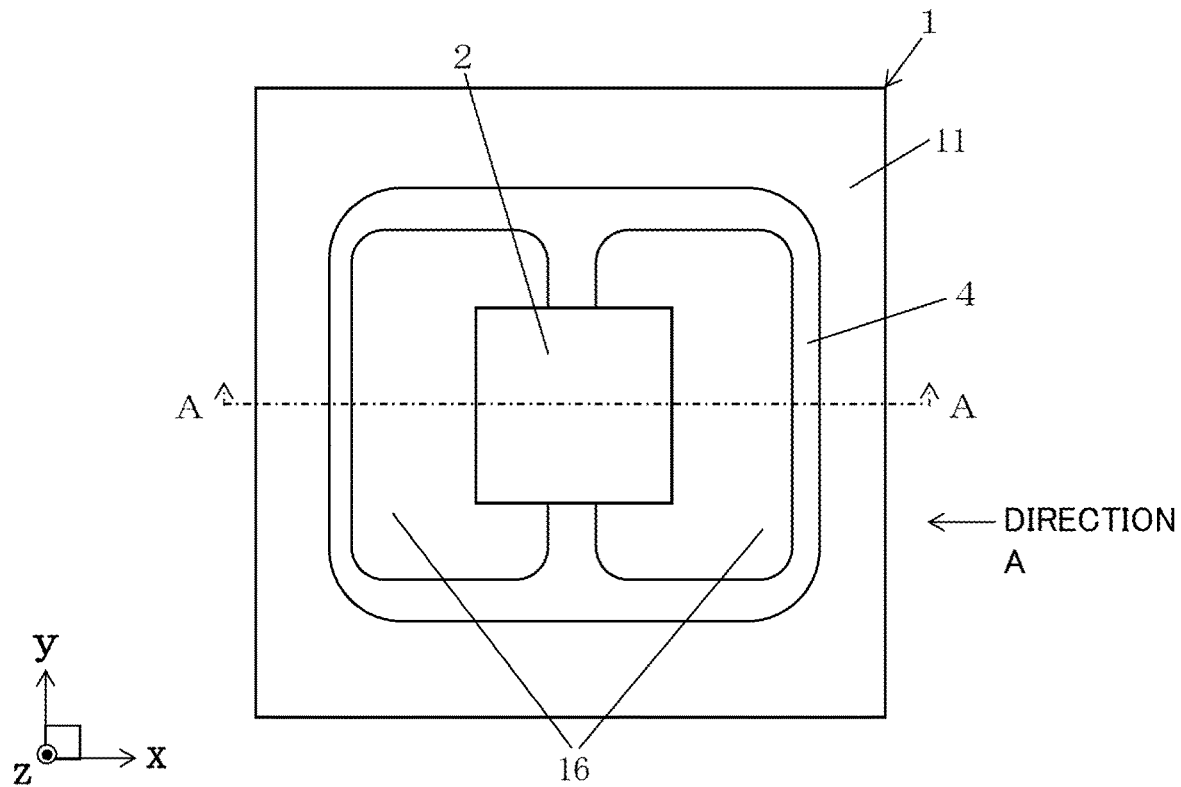
FIG. 7A is a top view of an electronic device of a second embodiment.
Figure 7B:
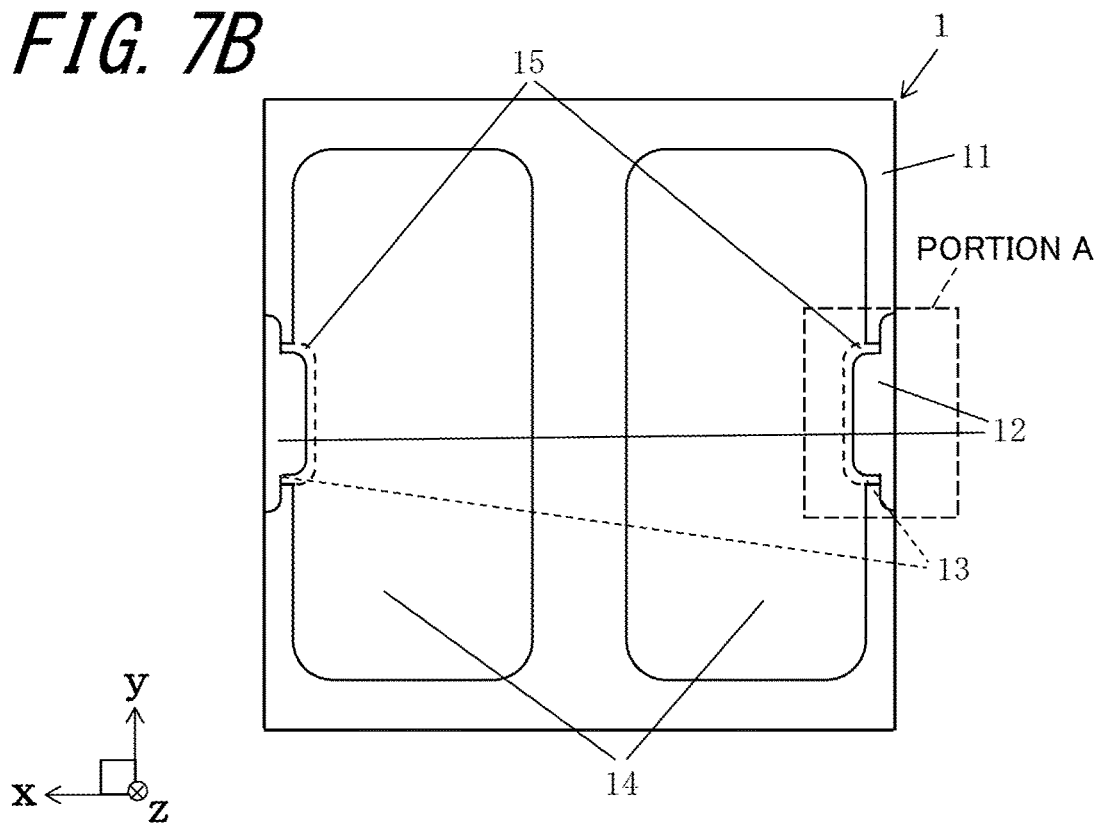
FIG. 7B is a bottom view of FIG. 7A.

As shown in, for example, FIG. 6, the external electrodes 14 of the electronic device of the present embodiment are connected to the connection pads 51 of the module substrate 5 by the solder 6 to form the electronic module. For example, as shown in FIG. 6, for the electronic device, the external electrodes 14 of the wiring board 1 on an upper side are connected to the connection pads 51 of the module substrate 5.

The wiring board 1 of the present embodiment includes the insulating substrate 11 having the cutout portions 12 that opens in the corresponding main surface of the insulating substrate 11 and the side surface of the insulating substrate 11, the inner surface electrodes 13 on the inner surfaces of the corresponding cutout portions 12, and the external electrodes 14 on the corresponding main surface of the insulating substrate 11. The wiring board 1 of the present embodiment also includes the connecting sections 15 where the inner surface electrodes 13 and the corresponding external electrodes 14 are connected to each other. If each connecting section 1 is thicker than each inner surface electrode 13 and each external electrode 14, when the wiring board 1 and the module substrate 5 have been joined to each other, each connecting section 15, which is a boundary between the inner surface electrode 13 and its corresponding external electrode 14, is thick-walled, so that a structure including engaging sections with the solder 6 with respect to a direction orthogonal to a planar direction of the wiring board 1 is formed. This makes it possible to more reliably connect the wiring board 1 and the module substrate 5 to each other, and to easily dissipate heat at each connecting section 15, which is a boundary between the inner surface electrode 13 and its corresponding external electrode 14.

When a light emitting element is used as the electronic component 2, it is possible to more reliably connect the wiring board 1 and the module substrate 5 to each other, to easily dissipate heat at each connecting section 15, which is a boundary between the inner surface electrode 13 and its corresponding external electrode 14, and to form the wiring board 1 for a light emitting device having good brightness.

Figure 2:
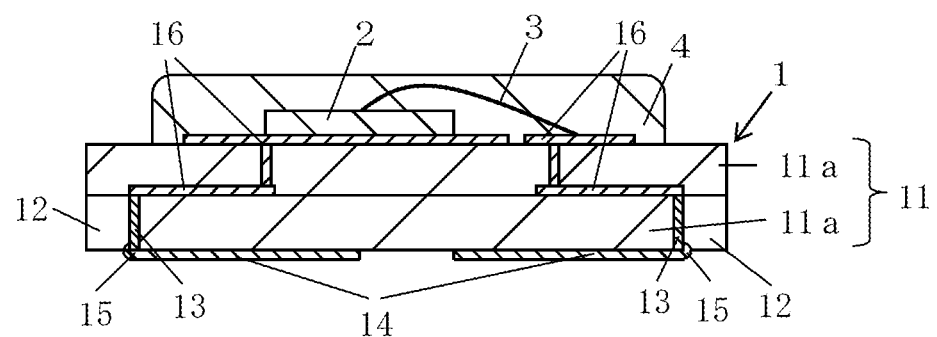
FIG. 2 is a vertical sectional view along line A-A of the electronic device shown in FIG. 1A.
Figure 2:
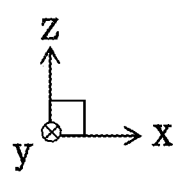

As in the embodiment shown in FIGS. 1A, 1B and 2, when the connecting sections 15 face two facing sides of the insulating substrate 11, it is possible to more reliably connect the wiring board 1 and the module substrate 5 to each other, and to satisfactorily easily dissipate heat at each connecting section 15, which is a boundary between the inner surface electrode 13 and its corresponding external electrode 14. It is possible to apply this structure even to wiring boards 1 of a second embodiment to a fifth embodiment described later.

As in the embodiment shown in FIGS. 1A to 4, when each connecting section 15 is positioned along an opening on a side of the main surface of its corresponding cutout portion 12, a structure in which engaging sections with the solder 6 with respect to the direction orthogonal to the planar direction of the wiring board 1 are disposed along the openings of the cutout portions 12 is formed. This makes it possible to more satisfactorily reliably connect the wiring board 1 and the module substrate 5 to each other, and to more satisfactorily easily dissipate heat at each connecting section 15, which is a boundary between the inner surface electrode 13 and its corresponding external electrode 14, along the opening of its corresponding cutout portion 12. It is possible to apply this structure even to the wiring boards 1 of the second embodiment to the fifth embodiment described later.

When each connecting section 15 has a length that is approximately equal to the width of its corresponding inner surface electrode 13 in a direction along the inner surface of its corresponding cutout portion 12, a structure in which engaging sections with the solder 6 with respect to the direction orthogonal to the planar direction of the wiring board 1 are disposed over the entire widths of the inner surface electrodes 13 is formed. This makes it possible to more satisfactorily reliably connect the wiring board 1 and the module substrate 5 to each other, and to more satisfactorily easily dissipate heat at each connecting section 15, which is a boundary between the inner surface electrode 13 and its corresponding external electrode 14, over the entire widths of the inner surface electrodes 13. It is possible to apply this structure even to the wiring boards 1 of the second embodiment to the fifth embodiment described later.

As in the embodiment shown in FIG. 2, when each connecting section 15 is thick in the direction along the main surfaces of the insulating substrate 11, a structure including engaging sections with the solder 6 with respect to the direction orthogonal to the planar direction of the wiring board 1 is formed. This makes it possible to more satisfactorily make the connection more reliable, and to more satisfactorily easily dissipate heat at each connecting section 15, which is a boundary between the inner surface electrode 13 and its corresponding external electrode 14. It is possible to apply this structure even to the wiring boards 1 of the second embodiment to the fifth embodiment described later.

Figure 3B:
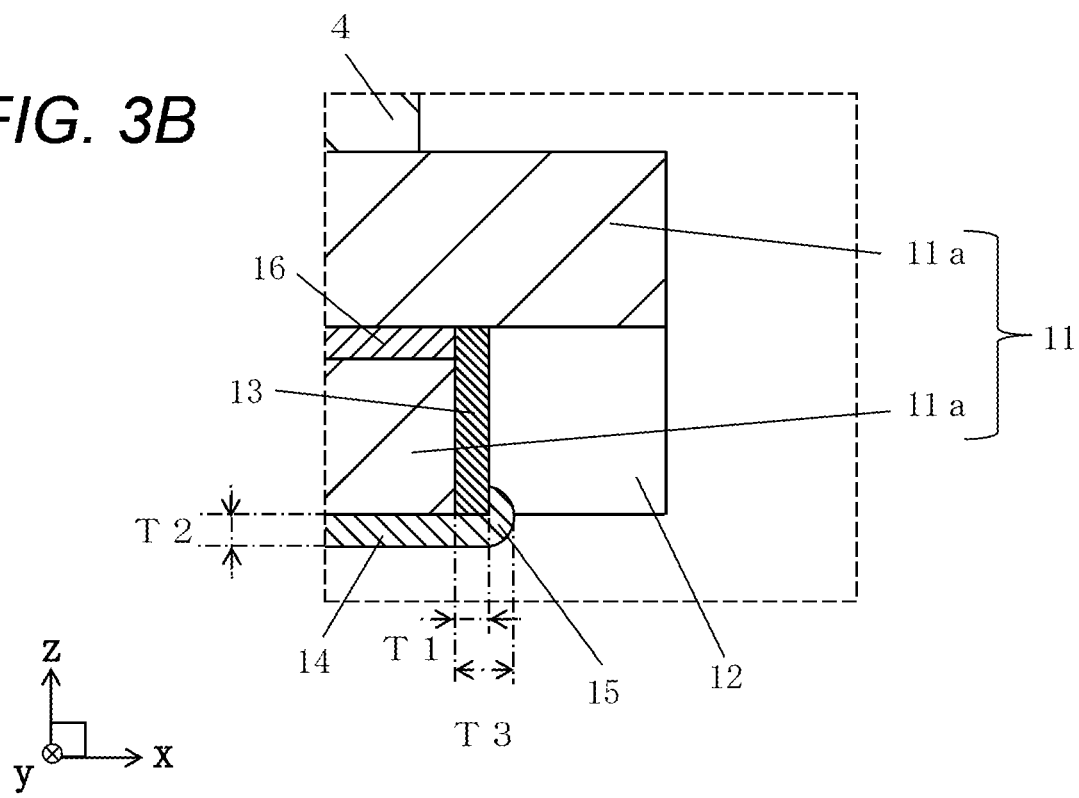
FIG. 3B is an enlarged vertical sectional view of a main portion along line A-A in FIG. 3A.
Figure 4:
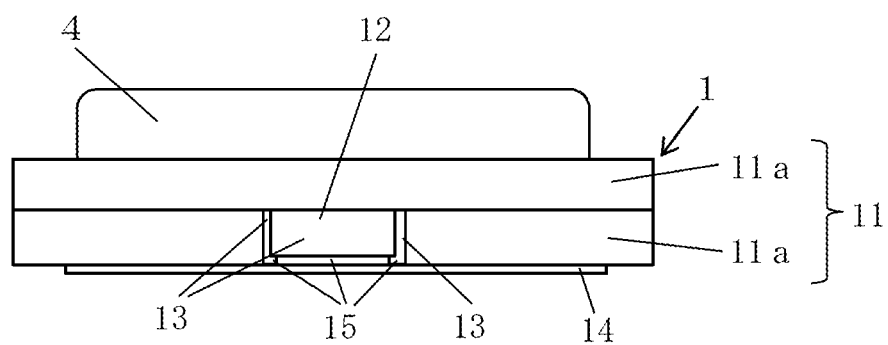
FIG. 4 is a side view in direction A in FIG. 1A.
Figure 4:
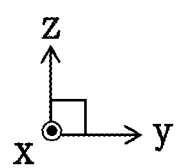

As in the embodiment shown in FIG. 2 and FIG. 3B, when each connecting section 15 is thick in the direction along the main surfaces of the insulating substrate 11 and a side surface exposed at its corresponding cutout portion 12 has a convexly curved shape, the solder 6 spreads out over the entire connecting sections 15, each of which is a boundary between the inner surface electrode 13 and its corresponding external electrode 14, to adhere easily. Therefore, a structure including engaging sections with the solder 6 with respect to the direction orthogonal to the planar direction of the wiring board 1 is formed. This makes it possible to more satisfactorily make the connection more reliable, and to more satisfactorily easily dissipate heat at each connecting section 15, which is a boundary between the inner surface electrode 13 and its corresponding external electrode 14. It is possible to apply this structure even to the wiring boards 1 of the second embodiment to the fifth embodiment described later. When each connecting section 15 is thick in the direction along the main surfaces of the insulating substrate 11 and the side surface exposed at its corresponding cutout portion 12 has a convexly curved shape along the opening on the side of the main surface of its corresponding cutout portion 12, the solder 6 spreads out over the entire connecting sections 15, each of which is a boundary between the inner surface electrode 13 and its corresponding external electrode 14, along the openings of the corresponding cutout portions 12, to adhere easily.

The wiring board 1 of the first embodiment can be manufactured by, for example, the following manufacturing method.

Figure 5A:
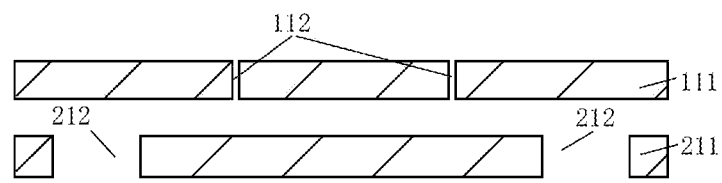
FIGS. 5A to 5E are each a sectional view showing a first manufacturing method of manufacturing inner surface electrodes, external electrodes, connecting sections, and wiring conductors of a wiring board of the first embodiment.
Figure 5B:
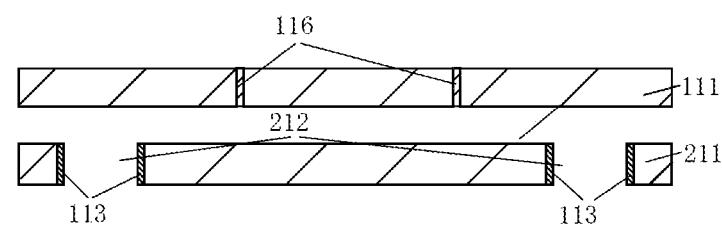
Figure 5C:
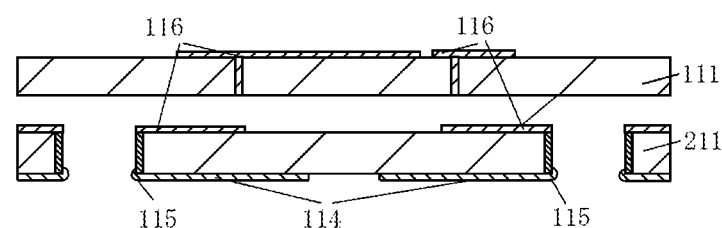
Figure 5D:
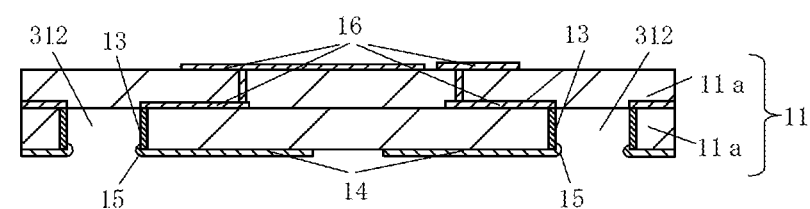
Figure 5E:
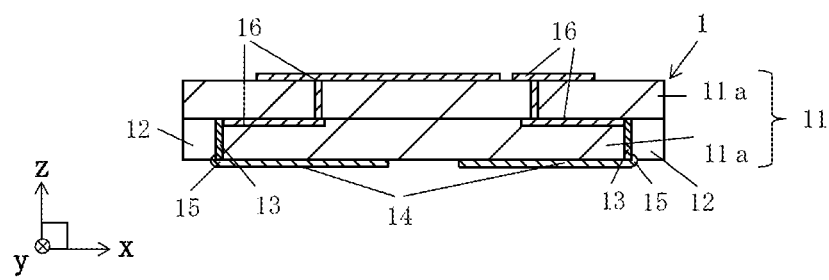

In a first manufacturing method, as in the embodiment shown in FIG. 5A, through holes 112 for the wiring conductors 16 are disposed in a ceramic green sheet 111 that becomes the insulating substrate 11. Through holes 212 for the cutout portions 12 are disposed in surfaces of a ceramic green sheet 211 that becomes the insulating substrate 11. As in the embodiment shown in FIG. 5B, the through holes 112, which are for the wiring conductors 16, in the ceramic green sheet 111 that becomes the insulating substrate 11 are filled with a conductor paste 116 for the wiring conductors 16. A conductor paste 113 for the inner surface electrodes 13 is applied to and printed onto the inner surfaces of the through holes 212 that become the cutout portions 12 in the ceramic green sheet 211 by screen printing. Then, as in the embodiment shown in FIG. 5C, a conductor paste 116 for the wiring conductors 16 is printed onto and applied to a surface of the ceramic green sheet 111 that becomes the insulating substrate 11. A conductor paste 114 for the external electrodes 14 and a conductor paste 116 for the wiring conductors 16 is printed onto and applied to corresponding surfaces of the ceramic green sheet 211 that becomes the insulating substrate 11, in order to connect these conductor pastes to the conductor paste 113 for the inner surface electrodes 13. Here, the conductor paste 114 for the external electrodes 14 is caused to extend along and to be printed onto and applied to the inner surfaces of the through holes 212 that become the cutout portions 12 such that end portions of the conductor paste 114 for the external electrodes 14 overlap surfaces of the conductor paste 113 for the inner surface electrodes 13. Then, by laminating the ceramic green sheet 111 and the ceramic green sheet 211 upon each other and applying pressure to the ceramic green sheets 111 and 211, a ceramic green laminate body that becomes the insulating substrate 11 in which the conductor paste 113 for the inner surface electrodes 13 is thick at each connecting section where the conductor paste 113 for the inner surface electrode 13 and the conductor paste 114 for the external electrode 14 are connected to each other is formed. By firing the green ceramic multilayer body, as in the embodiment shown in FIG. 5D, the insulating substrate 11 having recessed portions 312 where the connecting sections 15 are thicker than the inner surface electrodes 13 and the external electrodes 14 is formed. Further, as in the embodiment shown in FIG. 5E, by cutting the recessed portions 312, it is possible to manufacture the wiring board 1 in which each connecting section 15 that is positioned on the inner surface of its corresponding cutout portion 12 and that is where the inner surface electrode 13 and its corresponding external electrode 14 are connected to each other is thicker than each inner surface electrode 13 and each external electrode 14.

Since the electronic device of the present disclosure includes the wiring board having the above-described structure and the electronic component mounted on the wiring board, the electronic device is capable of being highly reliable for a long time.

Since the electronic module of the present disclosure includes the module substrate including connection pads and the electronic device having the above-described structure and connected to the connection pads with a solder, the electronic module is capable of being highly reliable for a long time.

The wiring board 1 of the present embodiment is suitably usable in a small electronic device. When the electronic component 2 is a light emitting element, the wiring board 1 is suitably usable as a wiring board 1 for a light emitting device having high brightness.

Second Embodiment

Next, the electronic device according to the second embodiment is described with reference to FIGS. 7A to 11E.

The electronic device of the second embodiment differs from the electronic device of the above-described first embodiment in that each connecting section 15 is thick in a thickness direction of an insulating substrate 11 (z direction in FIGS. 7A to 11E). As in the embodiment shown in FIGS. 7A and 7B, each cutout portion 12 of the second embodiment has a shape formed by dividing a columnar shape or a frustum so as to have cutouts having a plurality of sizes that overlap each other. In the embodiment shown in FIGS. 7B and 9A, in plan perspective, a region of a side surface of each inner surface electrode 13 that overlaps a corresponding connecting section 15 is shown by broken lines. In the embodiment shown in FIGS. 7A to 11E, the insulating substrate 11 of a wiring board 1 of the second embodiment includes two insulating layers 11a. Each cutout portion 12 is disposed at the insulating layer 11a on a side of a first main surface (a lower surface in FIGS. 7A to 11E) of the two insulating layers 11a of the insulating substrate 11.

Similarly to the wiring board 1 of the first embodiment, a thickness T3 of each connecting section 15 of the wiring board 1 of the second embodiment is greater than a thickness T1 of each inner surface electrode 13 and a thickness T2 of each external electrode 14 (T3>T1, T3>T2). The thickness T3 of each connecting section 15 is in a range of substantially $1.1T1 \leq T3 \leq 3T1$, and $1.1T2 \leq T3 \leq 3T2$.

In the wiring board 1 of the second embodiment, each connecting section 15 is thick in the thickness direction of the insulating substrate 11, so that a structure including engaging sections with a solder 6 with respect to a direction orthogonal to the thickness direction of the wiring board 1 is formed. This makes it possible to more satisfactorily reliably connect the wiring board 1 and a module substrate 5 to each other, and to more satisfactorily easily dissipate heat at each connecting section 15, which is a boundary between the inner surface electrode 13 and its corresponding external electrode 14.

By enlarging the space between the wiring board 1 and the module substrate 5 and disposing a large amount of solder 6, it is possible to more reliably connect the wiring board 1 and the module substrate 5 to each other, and to more satisfactorily easily dissipate heat at each connecting section 15, which is a boundary between the inner surface electrode 13 and its corresponding external electrode 14.

Figure 8:
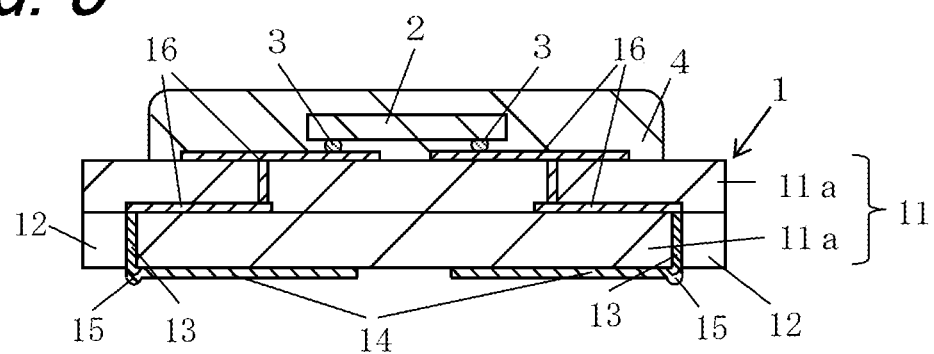
FIG. 8 is a vertical sectional view along line A-A of the electronic device shown in FIG. 7A.
Figure 8:
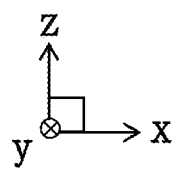
Figure 9A:
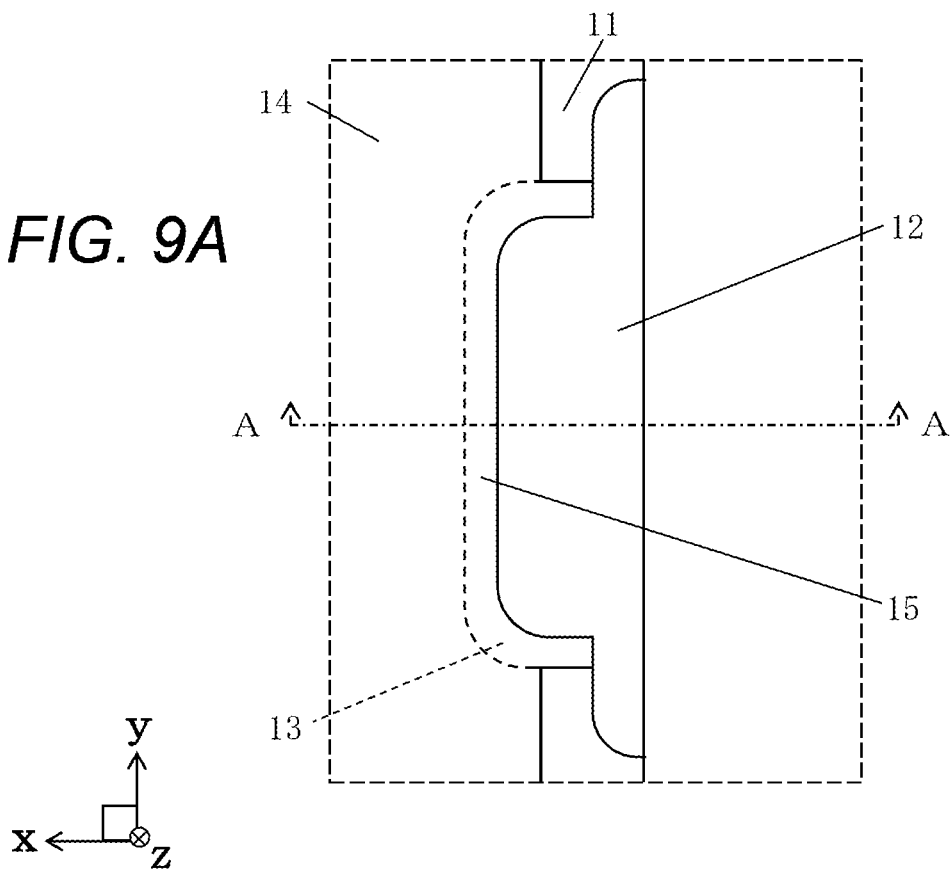
FIG. 9A is an enlarged bottom view of a main portion of a portion A of FIG. 7B.
Figure 9B:
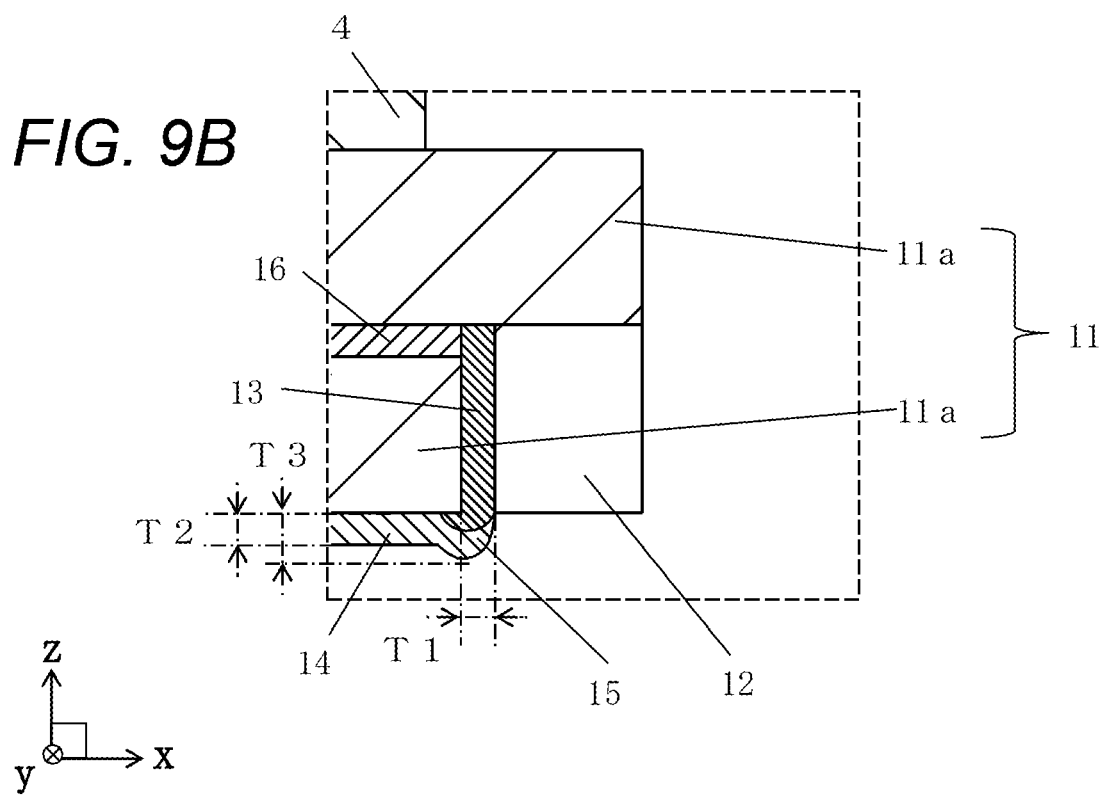
FIG. 9B is an enlarged vertical sectional view of a main portion along line A-A in FIG. 9A.
Figure 10:
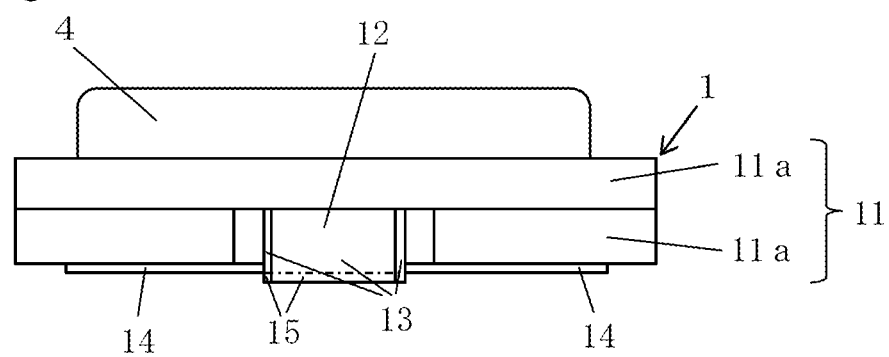
FIG. 10 is a side view in direction A in FIG. 7A.
Figure 10:
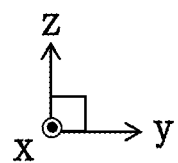

As in the embodiment shown in FIGS. 8, 9A and 9B, when the connecting sections 15 that are thick in the thickness direction of the insulating substrate 11 face two facing sides of the insulating substrate 11, the tilt when the wiring board 1 and the module substrate 5 are joined to each other is reduced; and when a light emitting element is used as an electronic component 2, it is possible to form the wiring board 1 for a light emitting device having good visibility and good brightness. It is possible to apply this structure even to the wiring boards 1 of the third embodiment to the fifth embodiment described later.

As in the embodiment shown in FIGS. 8 and 9B, when each connecting section 15 is thick in the thickness direction of the insulating substrate 11 and a lower surface of each connecting section 15 has a convexly curved shape, the solder 6 spreads out over the entire connecting sections 15, each of which is a boundary between the inner surface electrode 13 and its corresponding external electrode 14, to adhere easily. Therefore, a structure including engaging sections with the solder 6 with respect to the direction orthogonal to the thickness direction of the wiring board 1 is formed. This makes it possible to more satisfactorily make the connection more reliable, and to more satisfactorily easily dissipate heat at each connecting section 15, which is a boundary between the inner surface electrode 13 and its corresponding external electrode 14. It is possible to apply this structure even to the wiring boards 1 of the third embodiment to the fifth embodiment described later.

When each connecting section 15 is thick in a direction along main surfaces of the insulating substrate 11 and the lower surface of each connecting section 15 has a convexly curved shape along the opening on the side of the main surface of its corresponding cutout portion 12, the solder 6 spreads out over the entire connecting sections 15, each of which is a boundary between the inner surface electrode 13 and its corresponding external electrode 14, along the openings of the corresponding cutout portions 12, and can adhere easily.

The wiring board 1 of the second embodiment can be manufactured by, for example, the following manufacturing method.

Figure 11A:
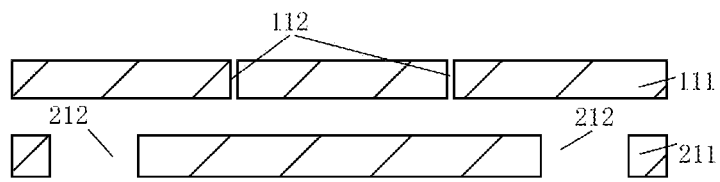
FIGS. 11A to 11E are each a sectional view showing a second manufacturing method of manufacturing inner surface electrodes, external electrodes, connecting sections, and wiring conductors of a wiring board of the second embodiment.
Figure 11B:
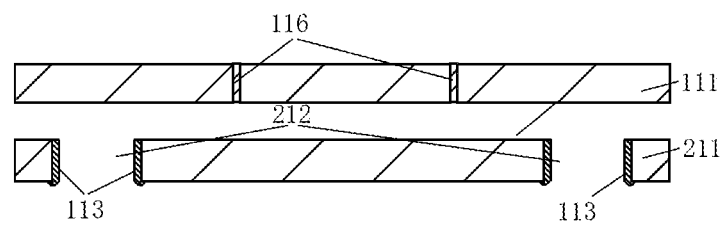
Figure 11C:
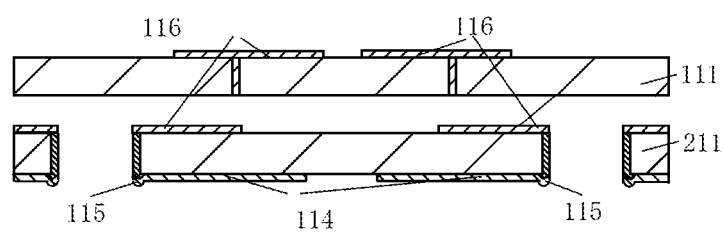
Figure 11D:
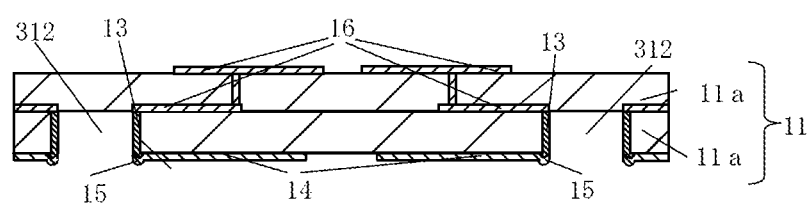
Figure 11E:
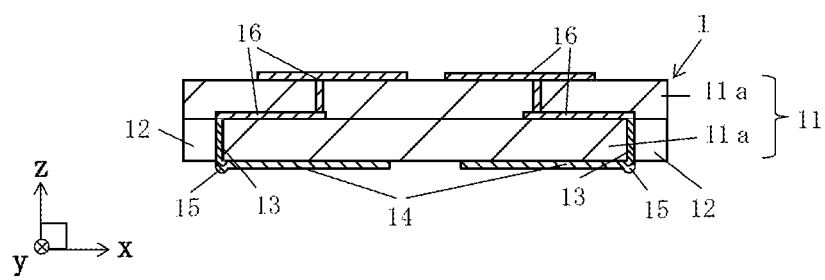
Figure 12A:
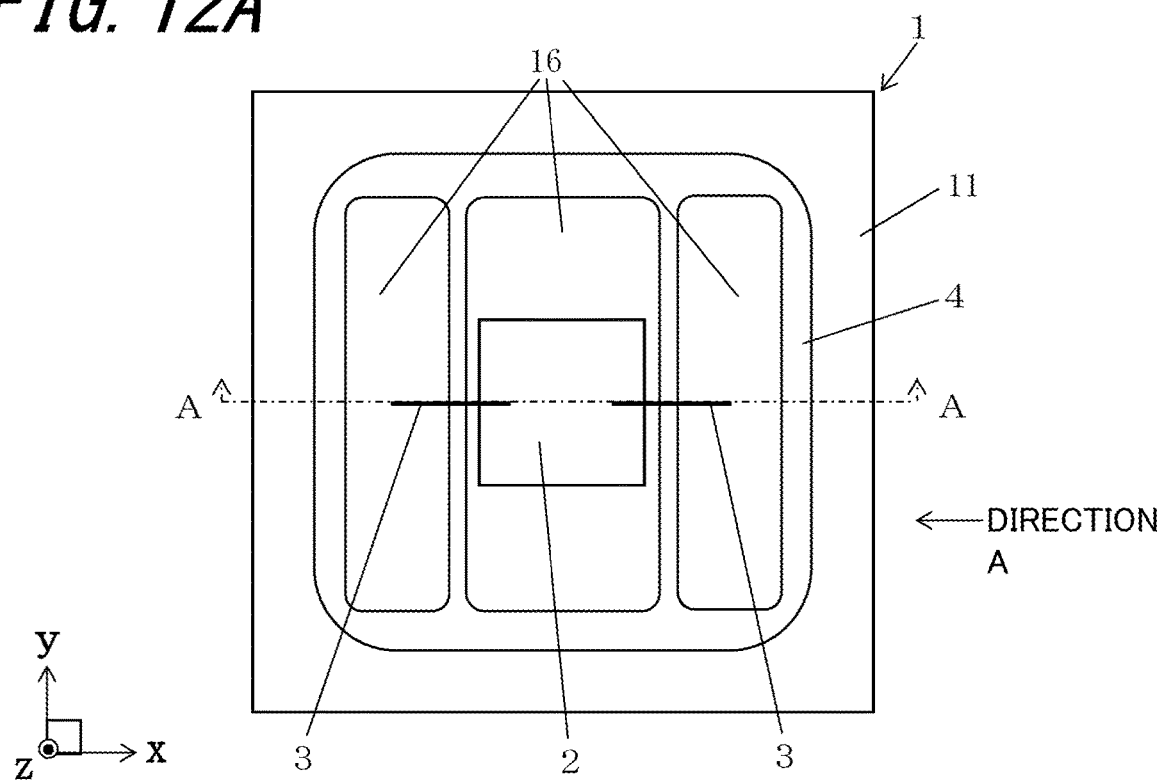
FIG. 12A is a top view of an electronic device of a third embodiment.
Figure 12B:
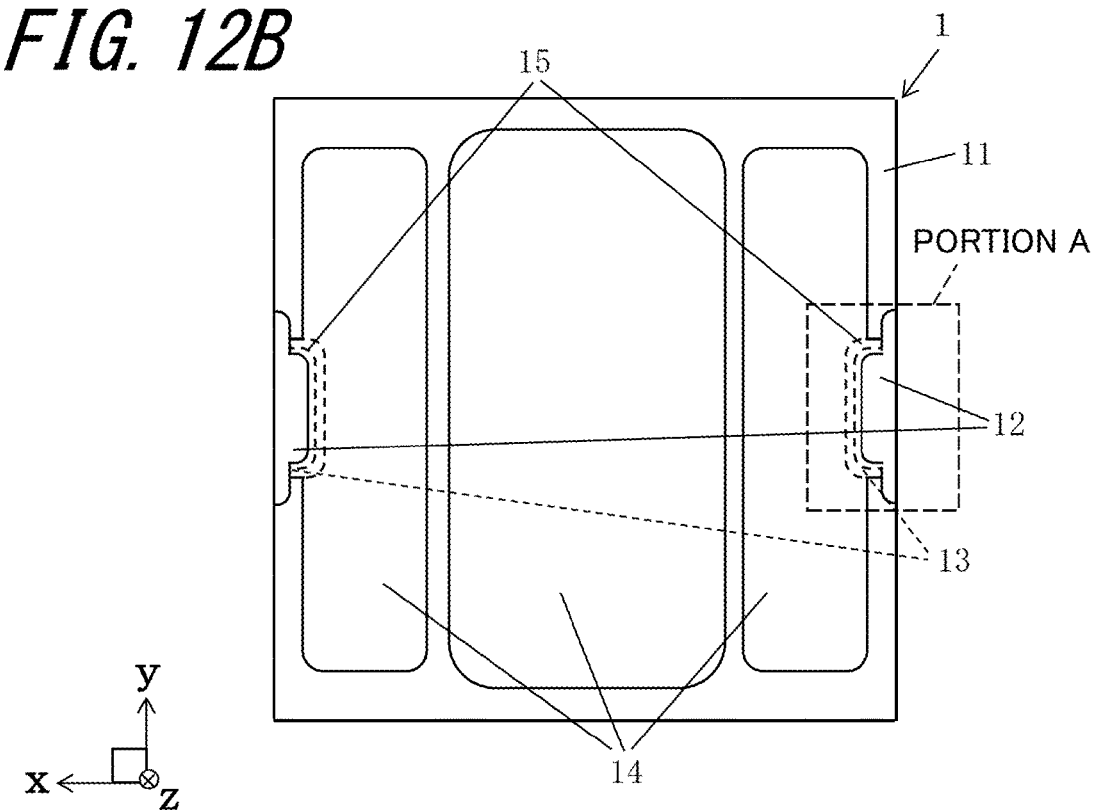
FIG. 12B is a bottom view of FIG. 12A.

In a second manufacturing method, as in the embodiment shown in FIG. 11A, through holes 112 for wiring conductors 16 are disposed in a ceramic green sheet 111 that becomes the insulating substrate 11. Through holes 212 for the cutout portions 12 are disposed in surfaces of a ceramic green sheet 211 that becomes the insulating substrate 11. As in the embodiment shown in FIG. 11B, the through holes 111, which are for the wiring conductors 16, in the ceramic green sheet 111 that becomes the insulating substrate 11 are filled with a conductor paste 116 for the wiring conductors 16. A conductor paste 113 for the inner surface electrodes 13 is applied to and printed onto inner surfaces of the through holes 212 that become the cutout portions 12 in the ceramic green sheet 211 by screen printing. Here, end portions of the conductor paste for the inner surface electrodes 13 is printed onto and applied so as to extend on a surface of the ceramic green sheet 211. Then, as in the embodiment shown in FIG. 11C, a conductor paste 116 for the wiring conductors 16 is printed onto and applied to a surface of the ceramic green sheet 111 that becomes the insulating substrate 11. A conductor paste 114 for the external electrodes 14 and a conductor paste 116 for the wiring conductors 16 are printed onto and applied to corresponding surfaces of the ceramic green sheet 211 that becomes the insulating substrate 11, in order to connect these conductor pastes to the conductor paste 113 for the inner surface electrodes 13. Here, end portions of the conductor paste 114 for the external electrodes 14 are applied by printing and overlap surfaces of the conductor paste 113 for the inner surface electrodes 13 extending on the surface of the ceramic green sheet 211. Then, by laminating the ceramic green sheet 111 and the ceramic green sheet 211 upon each other and applying pressure to the ceramic green sheets 111 and 211, a ceramic green laminate body that becomes the insulating substrate 11 in which the conductor paste 114 for the external electrodes 14 is thick at each connecting section where the conductor paste 113 for the inner surface electrode 13 and the conductor paste 114 for the external electrode 14 are connected to each other is formed. By firing the ceramic green laminate body, as in the embodiment shown in FIG. 11D, the insulating substrate 1 having recessed portions 312 where the connecting sections 15 are thicker than the inner surface electrodes 13 and the external electrodes 14 is formed. Further, as in the embodiment shown in FIG. 11E, by cutting the recessed portions 312, it is possible to manufacture the wiring board 1 in which each connecting section 15 that is positioned on the inner surface of its corresponding cutout portion and that is where the inner surface electrode 13 and its corresponding external electrode 14 are connected to each other is thicker than each inner surface electrode 13 and each external electrode 14.

Other portions of the wiring board 1 of the second embodiment can be manufactured by using a manufacturing method similar to the manufacturing method of manufacturing the wiring board 1 of the above-described first embodiment.

Third Embodiment

Next, the electronic device according to the third embodiment is described with reference to FIGS. 12A to 16E. In the embodiment shown in FIG. 12B, in plan perspective, a region of each inner surface electrode 13 that overlaps a corresponding connecting section 15 is shown by broken lines.

The electronic device of the third embodiment differs from the electronic devices of the above-described embodiments in that each connecting section 15 is thick in a direction of main surfaces of an insulating substrate 11 (x-y plane direction in FIGS. 12A to 16E) and in a thickness direction of the insulating substrate 11 (z direction in FIGS. 12A to 16E). In the embodiment shown in FIG. 12B and FIG. 14A, in plan perspective, a region of a side surface of each inner surface electrode 13 that overlaps its corresponding connecting section 15 is shown by broken lines. In the embodiment shown in FIGS. 12A to 16E, the insulating substrate 11 of a wiring board 1 of the third embodiment includes two insulating layers 11a. Each cutout portion 12 is disposed at the insulating layer 11a on a side of a first main surface (a lower surface in FIGS. 12A to 16E) of the two insulating layers 11a of the insulating substrate 11.

Similarly to the wiring boards 1 of the above-described embodiments, a thickness T3 of each connecting section 15 of the wiring board 1 of the third embodiment is greater than a thickness T1 of each inner surface electrode 13 and a thickness T2 of each external electrode 14 (T3>T1, T3>T2). The thickness T3 of each connecting section 15 is set in a range of substantially $1.1T1 \leq T3 \leq 3T1$, and $1.1T2 \leq T3 \leq 3T2$.

In the wiring board 1 of the third embodiment, each connecting section 15 is thick in the direction of the main surfaces of the insulating substrate 11 and in the thickness direction of the insulating substrate 11, so that a structure including engaging sections with a solder 6 with respect to a direction orthogonal to a planar direction of the wiring board 1 and a direction orthogonal to the thickness direction of the wiring board 1 is formed. This makes it possible to more satisfactorily effectively increase the reliability of the connection between the wiring board 1 and a module substrate 5, and to more satisfactorily easily dissipate heat at each connecting section 15, which is a boundary between the inner surface electrode 13 and its corresponding external electrode 14.

When each connecting section 15 is thick from the direction along the main surfaces of the insulating substrate 11 to the thickness direction of the insulating substrate 11, a structure including engaging sections with the solder 6 with respect to the orthogonal directions from the planar direction to the thickness direction of the wiring board 1 is formed. This makes it possible to more effectively increase the reliability of the connection between the wiring board 1 and the module substrate 5, and to more satisfactorily easily dissipate heat at each connecting section 15, which is a boundary between the inner surface electrode 13 and its corresponding external electrode 14.

Figure 13:
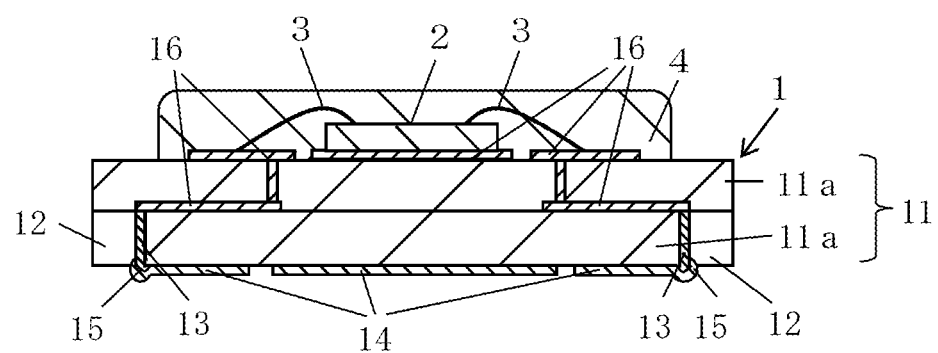
FIG. 13 is a vertical sectional view along line A-A of the electronic device shown in FIG. 12A.
Figure 13:
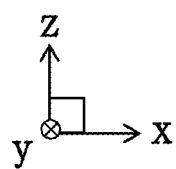
Figure 14A:
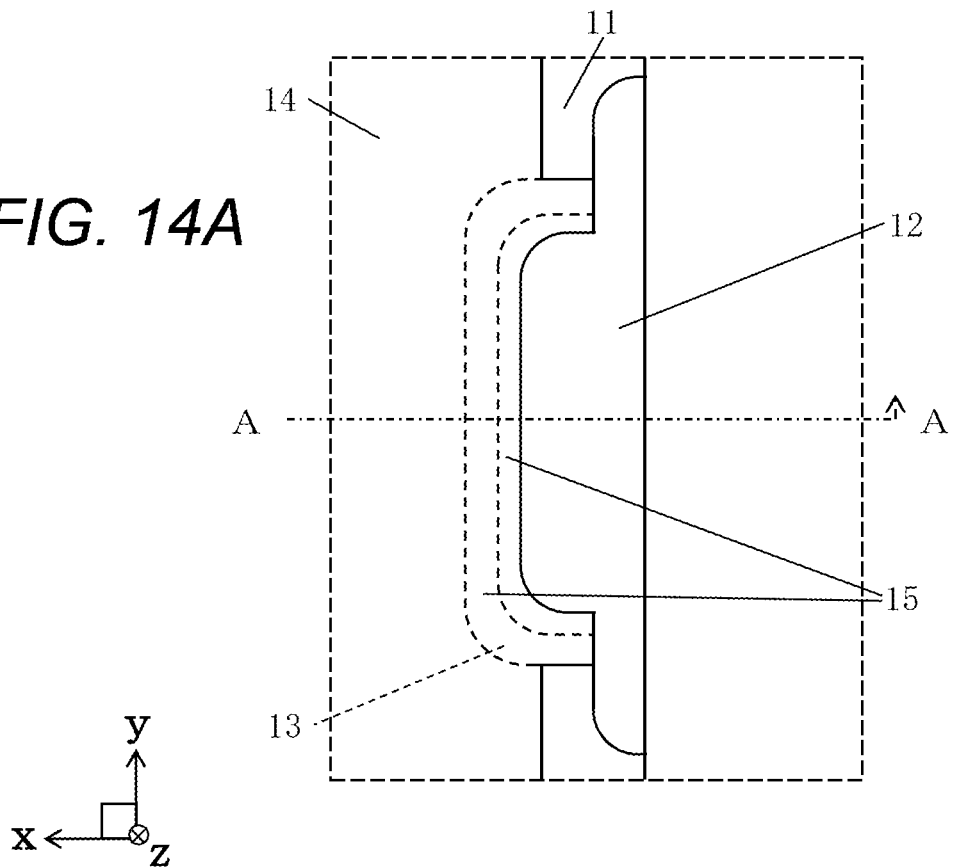
FIG. 14A is an enlarged bottom view of a main portion of a portion A of FIG. 12B.
Figure 14B:
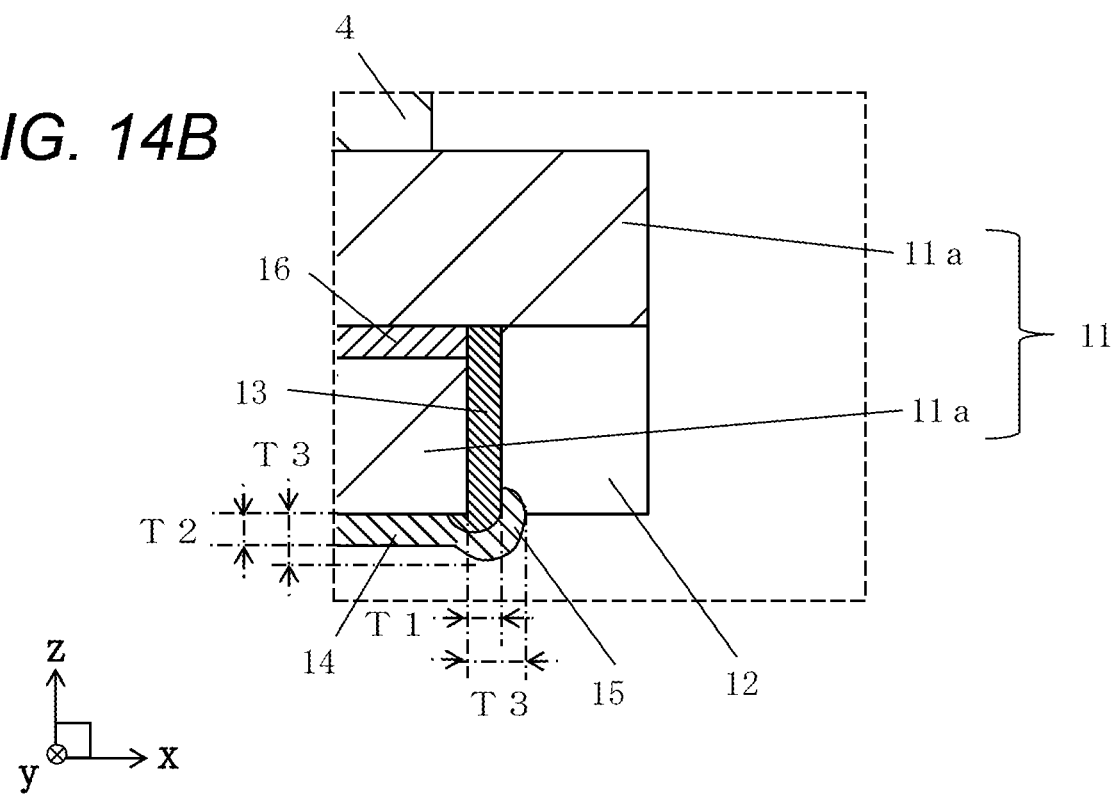
FIG. 14B is an enlarged vertical sectional view of a main portion along line A-A in FIG. 14A.
Figure 15:
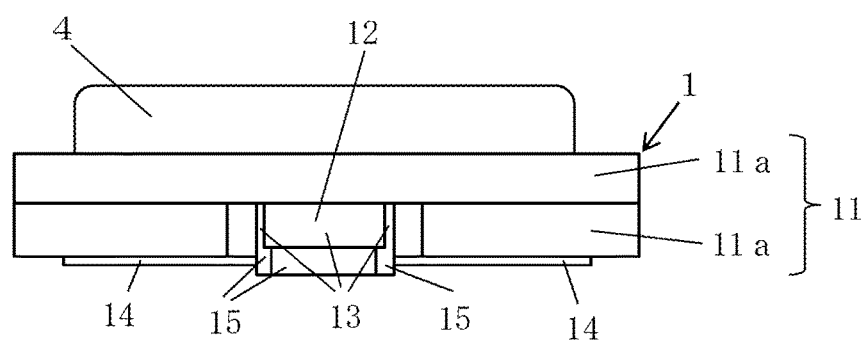
FIG. 15 is a side view in direction A in FIG. 12A.
Figure 15:
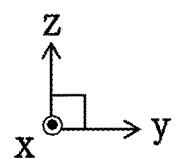

As in the embodiment shown in FIG. 13 and FIG. 14B, when each connecting section 15 is thick in the direction along the main surfaces of the insulating substrate 11 and in the thickness direction of the insulating substrate 11, and a side surface and the lower surface of each connecting section 15 exposed at its corresponding cutout portion 12 have convexly curved shapes, the solder 6 spreads out over the entire connecting sections 15, each of which is a boundary between the inner surface electrode 13 and its corresponding external electrode 14, to adhere easily. Therefore, a structure including engaging sections with the solder 6 with respect to the direction orthogonal to the planar direction of the wiring board 1 and the direction orthogonal to the thickness direction of the wiring board 1 is formed. This makes it possible to more satisfactorily make the connection more reliable, and to more satisfactorily easily dissipate heat at each connecting section 15, which is a boundary between the inner surface electrode 13 and its corresponding external electrode 14. It is possible to apply this structure even to the wiring boards 1 of the third embodiment to the fifth embodiment described later.

When each connecting section 15 is thick in the direction along the main surfaces of the insulating substrate 11 and in the thickness direction of the insulating substrate 11, and the side surface and the lower surface of each connecting section 15 exposed at its corresponding cutout portion 12 have convexly curved shapes, the solder 6 spreads out over the entire connecting sections 15, each of which is a boundary between the inner surface electrode 13 and its corresponding external electrode 14, along the openings of the corresponding cutout portions 12, and can adhere easily.

The wiring board 1 of the third embodiment can be manufactured by, for example, the following manufacturing method.

Figure 16A:
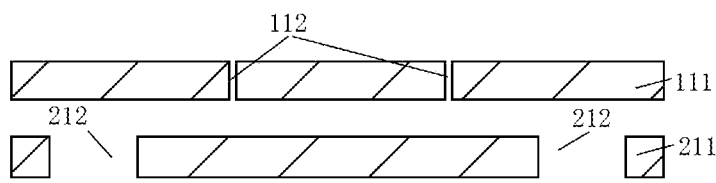
FIGS. 16A to 16E are each a sectional view showing a third manufacturing method of manufacturing inner surface electrodes, external electrodes, connecting sections, and wiring conductors of a wiring board of the third embodiment.
Figure 16B:
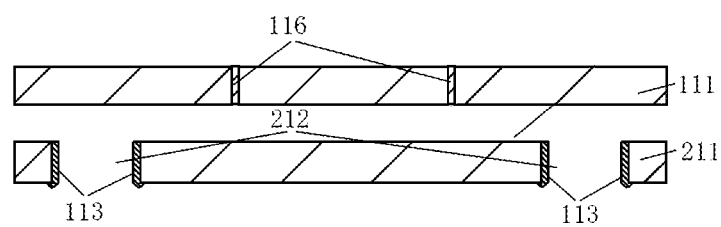
Figure 16C:
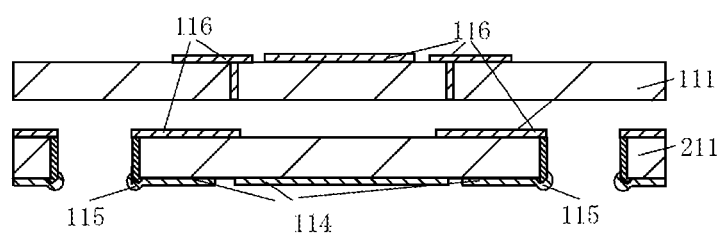
Figure 16D:
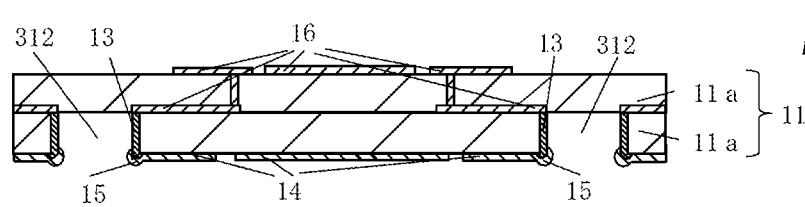
Figure 16E:
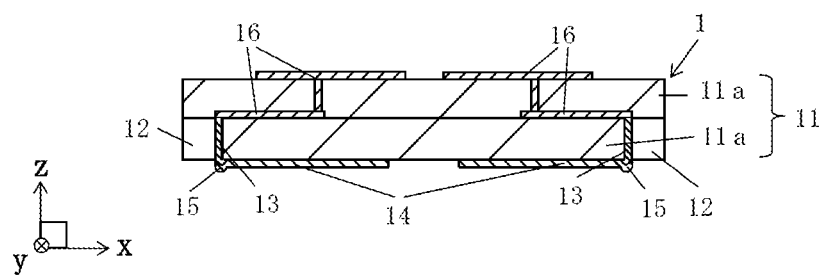

In a third manufacturing method, as in the embodiment shown in FIG. 16A, through holes 112 for wiring conductors 16 are disposed in a ceramic green sheet 111 that becomes the insulating substrate 11. Through holes 212 for the cutout portions 12 are disposed in surfaces of a ceramic green sheet 211 that becomes the insulating substrate 11. As in the embodiment shown in FIG. 16B, the through holes 111, which are for the wiring conductors 16, in the ceramic green sheet 111 that becomes the insulating substrate 11 are filled with a conductor paste 116 for the wiring conductors 16. A conductor paste 113 for the inner surface electrodes 13 is applied to and printed onto inner surfaces of the through holes 212 that become the cutout portions 12 in the ceramic green sheet 211 by screen printing. Here, end portions of the conductor paste 113 for the inner surface electrodes 13 are printed onto and applied so as to extend on a surface of the ceramic green sheet 211. Then, as in the embodiment shown in FIG. 16C, a conductor paste 116 for the wiring conductors 16 is printed onto and applied to a surface of the ceramic green sheet 111 that becomes the insulating substrate 11. A conductor paste 114 for the external electrodes 14 and a conductor paste 116 for the wiring conductors 16 are printed onto and applied to corresponding surfaces of the ceramic green sheet 211 that becomes the insulating substrate 11, in order to connect these conductor pastes to the conductor paste 113 for the inner surface electrodes 13. Here, the conductor paste 114 for the external electrodes 14 is caused to extend along and to be printed onto and applied to the inner surfaces of the through holes 212 that become the cutout portions 12 such that the conductor paste for the inner surface electrodes 13 and the conductor paste for the external electrodes 14 overlap each other at a surface of the ceramic green sheet 211 and at the inner surfaces of the through holes 212 for the cutout portions 12. Then, by laminating the ceramic green sheet 111 and the ceramic green sheet 211 upon each other and applying pressure to the ceramic green sheets 111 and 211, a ceramic green laminate body that becomes the insulating substrate 11 in which the conductor paste 113 for the inner surface electrodes 13 and the conductor paste 114 for the external electrodes 14 are thick at each connecting section where the conductor paste 113 for the inner surface electrodes 13 and the conductor paste 114 for the wiring conductors 16 are connected to each other is formed. By firing the ceramic green laminate body, as in the embodiment shown in FIG. 16D, the insulating substrate 11 having recessed portions 312 where each connecting section 15 is thicker than each inner surface electrode 13 and each external electrode 14 is formed. Further, as in the embodiment shown in FIG. 16E, by cutting the recessed portions 312, it is possible to manufacture the wiring board 1 in which each connecting section 15 that is positioned on the inner surface of its corresponding cutout portion 12 and that is where the inner surface electrode 13 and its corresponding external electrode 14 are connected to each other is thicker than each inner surface electrode 13 and each external electrode 14.

Other portions of the wiring board 1 of the third embodiment can be manufactured by using a manufacturing method similar to the manufacturing method of manufacturing the wiring boards 1 of the above-described embodiments.

Fourth Embodiment

Figure 17A:
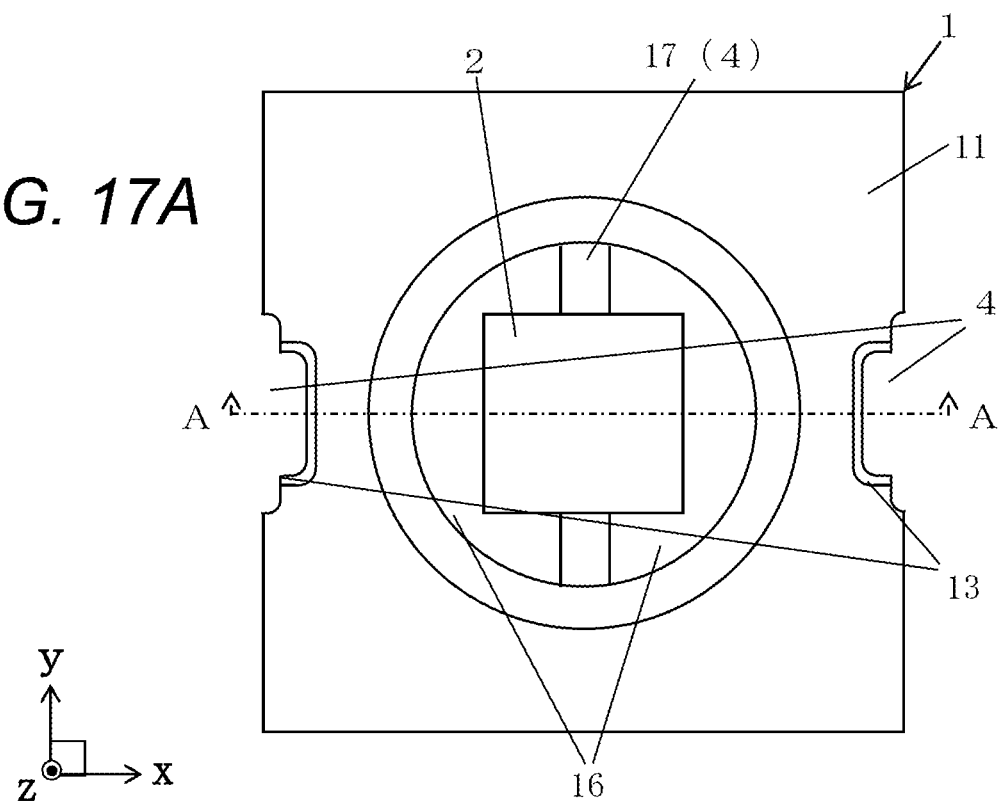
FIG. 17A is a top view of an electronic device of a fourth embodiment.
Figure 17B:
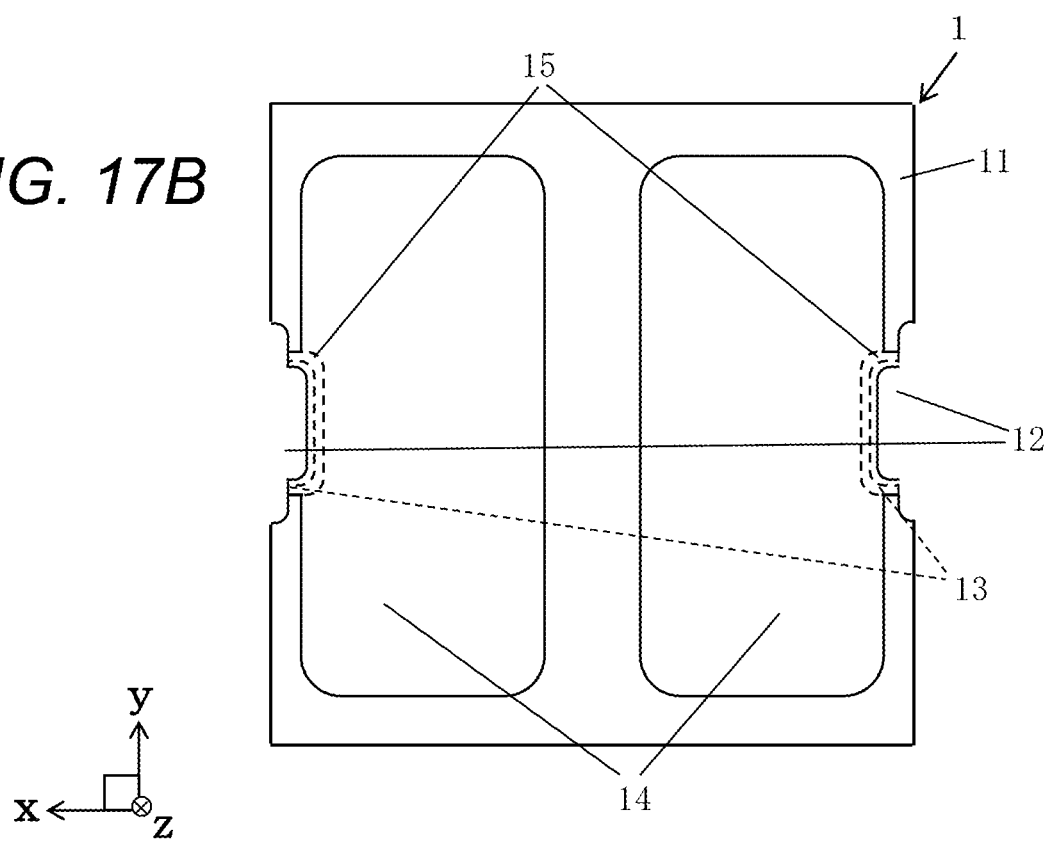
FIG. 17B is a bottom view of FIG. 17A.

Next, the electronic device according to the fourth embodiment is described with reference to FIGS. 17A, 17B and 18. The electronic device of the fourth embodiment differs from the electronic devices of the above-described embodiments in that cutout portions 12 opens in both main surfaces and side surfaces of an insulating substrate 11. The insulating substrate 11 includes a recessed portion 17 at a second main surface (upper surface in FIGS. 17A, 17B and 18). In the embodiment shown in FIG. 17B, in plan perspective, a region of a side surface of each inner surface electrode 13 that overlaps a corresponding connecting section 15 is shown by broken lines.

Similarly to the wiring boards 1 of the above-described embodiments, a thickness T3 of each connecting section 15 of the wiring board 1 of the fourth embodiment is greater than a thickness T1 of each inner surface electrode 13 and a thickness T2 of each external electrode 14 (T3>T1, T3>T2). The thickness T3 of each connecting section 15 is set in a range of substantially $1.1T1 \leq T3 \leq 3T1$, and $1.1T2 \leq T3 \leq 3T2$.

As in the wiring board 1 of the third embodiment, in the wiring board 1 of the fourth embodiment, when the wiring board 1 and a module substrate 5 have been joined to each other, each connecting section 15, which is a boundary between the inner surface electrode 13 and its corresponding external electrode 14, is thick-walled, so that a structure including engaging sections with a solder 6 with respect to a direction orthogonal to a planar direction of the wiring board 1 and a direction orthogonal to a thickness direction of the wiring board 1 is formed. This makes it possible to more effectively increase the reliability of the connection between the wiring board 1 and the module substrate 5, and to easily dissipate heat at each connecting section 15, which is a boundary between the inner surface electrode 13 and its corresponding external electrode 14.

Each connecting section 15 is thick from a direction along the main surfaces of the insulating substrate 11 to the thickness direction of the insulating substrate 11, so that a structure including engaging sections with the solder 6 with respect to the orthogonal directions from the planar direction to the thickness direction of the wiring board 1 is formed. This makes it possible to more effectively increase the reliability of the connection between the wiring board 1 and the module substrate 5, and to more satisfactorily easily dissipate heat at each connecting section 15, which is a boundary between the inner surface electrode 13 and its corresponding external electrode 14.

The recessed portion 17 is disposed, for example, for mounting the electronic component 2 on a bottom surface of the recessed portion 17. Wiring conductors 16 for electrical connection with the electronic component 2 are led out to the bottom surface of the recessed portion 17. In plan view, the recessed portion 17 is rectangular with arc-shaped corner portions and is positioned at a central portion of the insulating substrate 11. In the embodiment shown in FIGS. 17A, 17B and 18, the insulating substrate 11 includes three insulating layers 11a, and the recessed portion 17 is positioned from the first insulating layer 11a to the second insulating layer 11a on a side of a first main surface.

The recessed portion 17 can be formed, for example, as follows. By, for example, performing laser processing or punching using a die on several ceramic green sheets for the insulating substrate 11, through holes that become the recessed portion 17 are disposed in the corresponding ceramic green sheets, and the ceramic green sheets are laminated on other ceramic green sheets that do not have through holes.

The wiring substrate 1 of the fourth embodiment can be manufactured by using a manufacturing method similar to the manufacturing method of manufacturing the wiring boards 1 of the above-described embodiments.

Fifth Embodiment

Next, the electronic device according to the fifth embodiment is described with reference to FIGS. 19A, 19B and 20. The electronic device of the fifth embodiment differs from the electronic device of the above-described first embodiment in that an insulating substrate 11 has vias 18 therein that are disposed in a thickness direction of the insulating substrate 11 and that connect external electrodes 14 and corresponding wiring conductors 16 to each other. In the embodiment shown in FIG. 19B, in plan perspective, a region of a side surface of each inner surface electrode 13 that overlaps its corresponding connecting section 15 is shown by broken lines. In the embodiment shown in FIG. 19B, in the plan perspective, a region of a side surface of each via 18 that overlaps its corresponding external electrode 14 is shown by broken lines.

Similarly to the wiring boards 1 of the above-described embodiments, a thickness T3 of each connecting section 15 of a wiring board 1 of the fifth embodiment is greater than a thickness T1 of each inner surface electrode 13 and a thickness T2 of each external electrode 14 (T3>T1, T3>T2). The thickness T3 of each connecting section 15 is set in a range of substantially $1.1T1 \leq T3 \leq 3T1$, and $1.1T2 \leq T3 \leq 3T2$.

As in the wiring board 1 of the third embodiment, in the wiring board 1 of the fifth embodiment, when the wiring board 1 and a module substrate 5 have been joined to each other, each connecting section 15, which is a boundary between the inner surface electrode 13 and its corresponding external electrode 14, is thick-walled, so that a structure including engaging sections with a solder 6 with respect to a direction orthogonal to a planar direction of the wiring board 1 and a direction orthogonal to a thickness direction of the wiring board 1 is formed. This makes it possible to more effectively increase the reliability of the connection between the wiring board 1 and the module substrate 5, and to easily dissipate heat at each connecting section 15, which is a boundary between the inner surface electrode 13 and its corresponding external electrode 14.

When each connecting section 15 is thick from a direction along main surfaces of the insulating substrate 11 to the thickness direction of the insulating substrate 11, a structure including engaging sections with the solder 6 with respect to the orthogonal directions from the planar direction to the thickness direction of the wiring board 1 is formed. This makes it possible to more effectively increase the reliability of the connection between the wiring board 1 and the module substrate 5, and to more satisfactorily easily dissipate heat at each connecting section 15, which is a boundary between the inner surface electrode 13 and its corresponding external electrode 14.

Figure 19A:
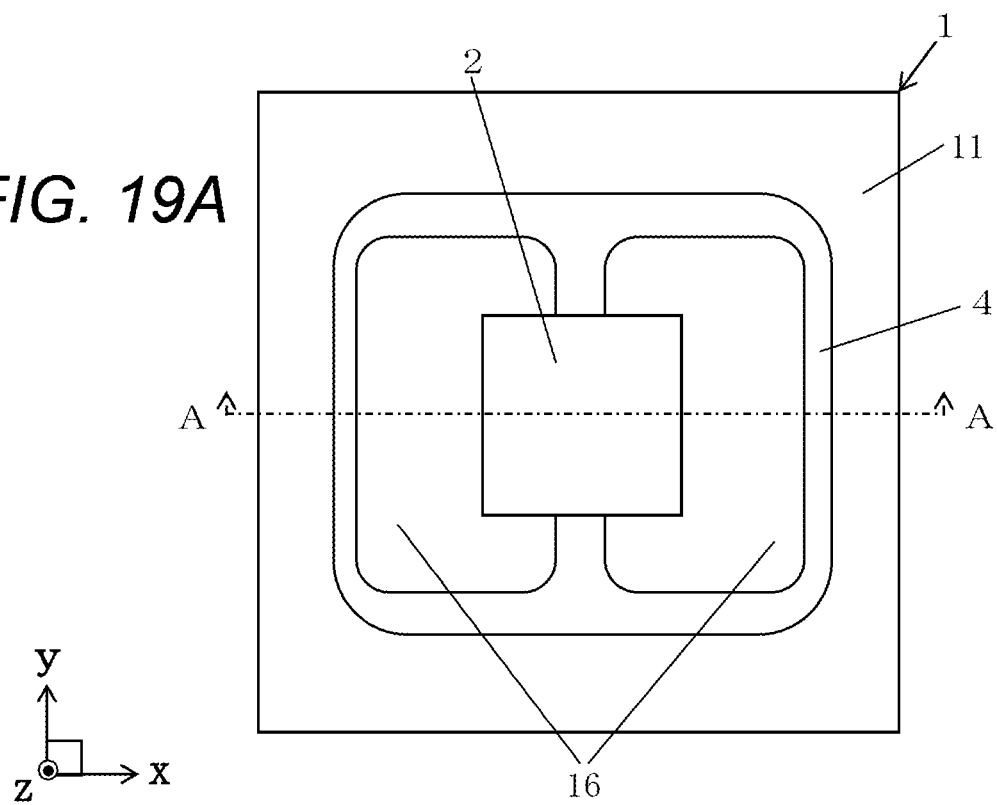
FIG. 19A is a top view of an electronic device of a fifth embodiment.
Figure 19B:
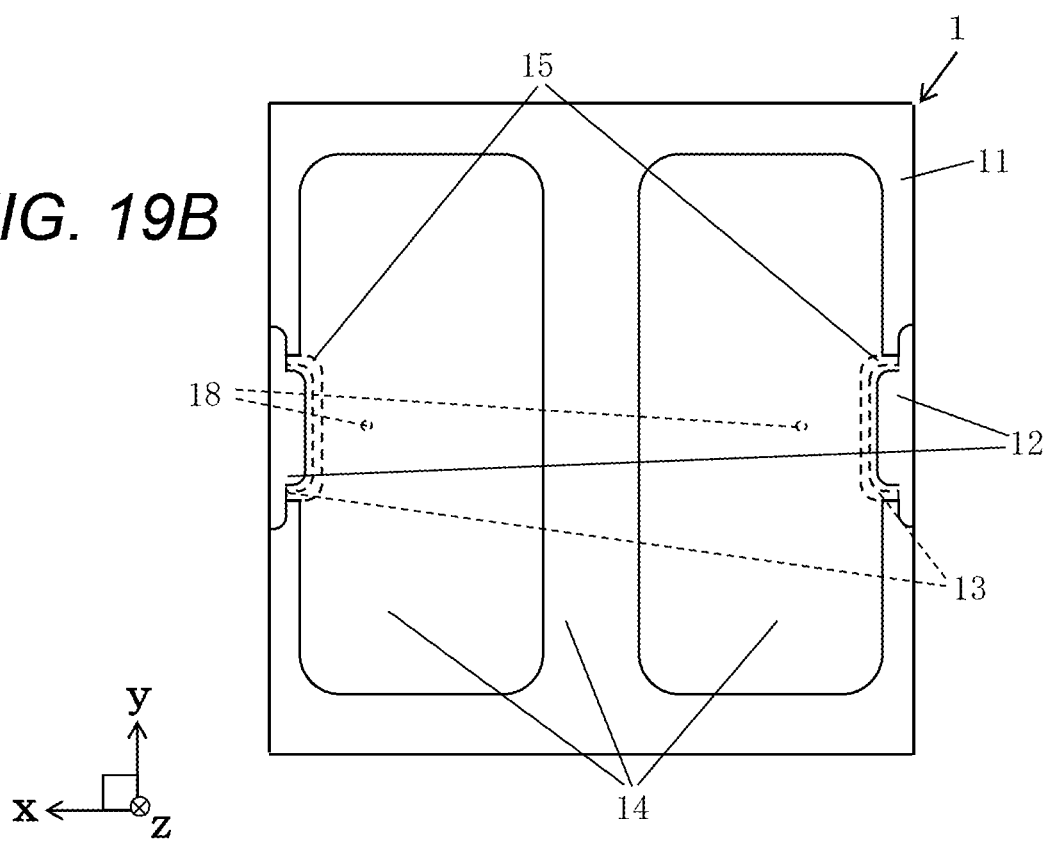
FIG. 19B is a bottom view of FIG. 19A.
Figure 20:
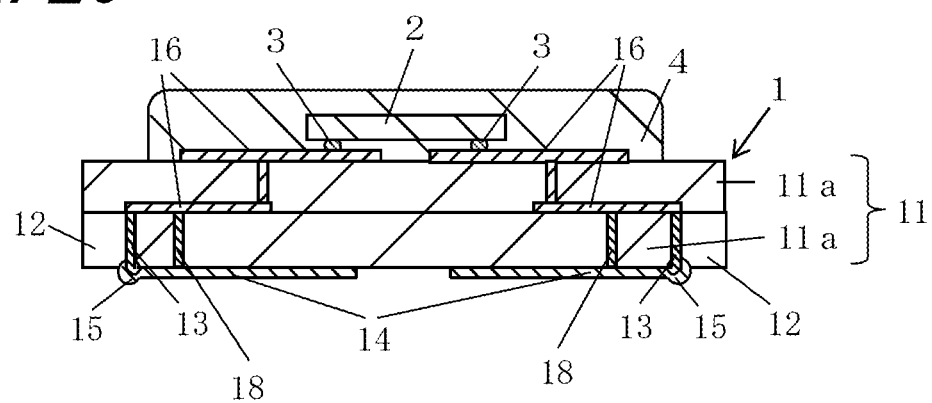
FIG. 20 is a vertical sectional view along line A-A of the electronic device shown in FIG. 19A.
Figure 20:
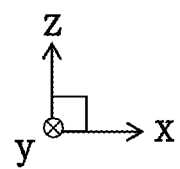

Although, in the embodiment shown in FIGS. 19A, 19B and 20, one via 18 is connected to one external electrode 14, the insulating substrate 1 may be one in which a plurality of vias 18 is connected to one external electrode 14.

Each via 18 can be manufactured by a manufacturing method similar to the manufacturing method of manufacturing through conductors of the wiring conductors 16.

The wiring board 1 of the fifth embodiment can be manufactured by using a manufacturing method similar to the manufacturing method of manufacturing the wiring boards 1 of the above-described embodiments.

The present disclosure is not limited to the above-described embodiments and can be variously modified. For example, in plan view, the insulating substrate 11 may have a rectangular shape having a cutout portion or a chamfered portion at a side surface or a corner portion.

Although, in the wiring boards 1 of the above-described embodiments, the external electrodes 14 are disposed on the lower surface of the insulating substrate 11, the external electrodes 14 may be disposed on the upper surface of the insulating substrate 11, that is, on the main surface on which the electronic component 2 is mounted.

The structures of the wiring boards 1 of the first to fifth embodiments may be combined with each other. For example, in the wiring boards 1 of the first or third to fifth embodiments, the wiring boards 1 may have a recessed portion 17. The wiring boards 1 of the first to fourth embodiments may have vias 18.

Although, in the above-described embodiments, the cutout portions 12, the inner surface electrodes 13, the external electrodes 14, and the connecting sections 15 are positioned on two facing sides of the insulating substrate 11, for example, when the insulating substrate 11 has a rectangular shape, the cutout portions 12, the inner surface electrodes 13, the external electrodes 14, and the connecting sections 15 may be positioned on four sides of the insulating substrate 11.

In the wiring board 1 in which each connecting section 15 is thick in the thickness direction of the insulating substrate 11, a surface of each external electrode 14 may have a region that is made partly thicker than a surrounding region so as to have a size about the same size ($\approx$T3) as each connecting section 15. This further reduces the tilt when the wiring board 1 and the module substrate 5 are joined to each other, and, when a light emitting element is used as the electronic component 2, it is possible to form the wiring board 1 for a light emitting device having good visibility and good brightness. For example, in the wiring board 1 of the fifth embodiment, a surface of each external electrode 14 that overlaps the via 18 in plan view may be thicker than the surrounding region.

Although, in the above-described embodiments, the insulating substrate 11 is described as including two or three insulating layers 11a, the insulating substrate 11 may include four or more insulating layers 11a.

The wiring board may be manufactured from a multipiece wiring board.

The invention claimed is:

1. A wiring board comprising:
   an insulating substrate comprising a cutout portion that opens in a main surface of the insulating substrate and a side surface of the insulating substrate;
   an inner surface electrode on an inner surface of the cutout portion;
   an external electrode on a region extending from the main surface of the insulating substrate to a side surface of the inner surface electrode; and
   a connecting section disposed on a lower surface of the inner surface electrode where the inner surface electrode and the external electrode are connected to each other,
   wherein the connecting section is thicker than the inner surface electrode and the external electrode, and at the connection section, the external electrode covers the side surface of the inner surface electrode.

2. The wiring board according to claim 1, wherein the connecting section is positioned along an opening of the cutout portion and the opening is on a side of the main surface.

3. The wiring board according to claim 2, wherein the connecting section has a length that is approximately equal to a width of the inner surface electrode in a direction along the inner surface of the cutout portion.

4. The wiring board according to claim 1, wherein the connecting section is thick in a direction along the main surface.

5. The wiring board according to claim 1, wherein the connecting section is thick in a thickness direction of the insulating substrate.

6. The wiring board according to claim 1, wherein the connecting section has a convexly curved shape.

7. An electronic device comprising: the wiring board according to claim 1; and an electronic component on the wiring board.

8. The wiring board according to claim 2, wherein the connecting section is thick in a direction along the main surface.

9. The wiring board according to claim 3, wherein the connecting section is thick in a direction along the main surface.

10. The wiring board according to claim 2, wherein the connecting section is thick in a thickness direction of the insulating substrate.

11. The wiring board according to claim 3, wherein the connecting section is thick in a thickness direction of the insulating substrate.

12. The wiring board according to claim 4, wherein the connecting section is thick in a thickness direction of the insulating substrate.

13. The wiring board according to claim 8, wherein the connecting section is thick in a thickness direction of the insulating substrate.

14. The wiring board according to claim 9, wherein the connecting section is thick in a thickness direction of the insulating substrate.

15. The wiring board according to claim 2, wherein the connecting section has a convexly curved shape.

16. The wiring board according to claim 3, wherein the connecting section has a convexly curved shape.

17. The wiring board according to claim 4, wherein the connecting section has a convexly curved shape.

18. The wiring board according to claim 5, wherein the connecting section has a convexly curved shape.

\* \* \* \* \*